United States Patent
Zhang et al.

(10) Patent No.: US 8,294,507 B2
(45) Date of Patent: Oct. 23, 2012

(54) WIDE BANDGAP BIPOLAR TURN-OFF THYRISTOR HAVING NON-NEGATIVE TEMPERATURE COEFFICIENT AND RELATED CONTROL CIRCUITS

(75) Inventors: Qingchun Zhang, Cary, NC (US); James Theodore Richmond, Hillsborough, NC (US); Robert J. Callanan, Raleigh, NC (US)

(73) Assignee: Cree, Inc., Durham, NC (US)

( * ) Notice: Subject to any disclaimer, the term of this patent is extended or adjusted under 35 U.S.C. 154(b) by 116 days.

(21) Appl. No.: 12/437,929

(22) Filed: May 8, 2009

(65) Prior Publication Data

US 2010/0283529 A1  Nov. 11, 2010

(51) Int. Cl.
 *H03K 17/72* (2006.01)
(52) U.S. Cl. ......... 327/440; 327/471; 327/474; 327/475
(58) Field of Classification Search .......... 327/440–442, 327/470–471, 474–475
 See application file for complete search history.

(56) References Cited

U.S. PATENT DOCUMENTS

| | | | |
|---|---|---|---|
| 3,217,176 A * | 11/1965 | Chin | 327/199 |
| 3,268,776 A * | 8/1966 | Reed | 361/154 |
| 3,439,189 A * | 4/1969 | Petry | 327/465 |
| 3,614,474 A * | 10/1971 | Hahn | 327/463 |
| 3,629,011 A | 12/1971 | Tohi et al. | |
| 3,906,298 A * | 9/1975 | Sylvan | 361/100 |
| 3,924,024 A | 12/1975 | Naber et al. | |
| 4,160,920 A * | 7/1979 | Courier de Mere | 327/470 |
| 4,242,690 A | 12/1980 | Temple | |
| 4,466,172 A | 8/1984 | Batra | |
| 4,581,542 A * | 4/1986 | Steigerwald | 327/440 |
| 4,644,637 A | 2/1987 | Temple | |
| 4,663,547 A * | 5/1987 | Baliga et al. | 327/377 |
| 4,811,065 A | 3/1989 | Cogan | |
| 4,875,083 A | 10/1989 | Palmour | |

(Continued)

FOREIGN PATENT DOCUMENTS

DE 39 42 640 A1 8/1990

(Continued)

OTHER PUBLICATIONS

Bhatnagar et al., "Comparison of 6H-SiC, 3C-SiC, and Si for Power Devices", IEEE Transactions on Electron Devices, vol. 40:3, pp. 645-655 (Mar. 1993).

(Continued)

*Primary Examiner* — Kenneth B. Wells
(74) *Attorney, Agent, or Firm* — Myers Bigel Sibley & Sajovec, P.A.

(57) ABSTRACT

An electronic device includes a wide bandgap thyristor having an anode, a cathode, and a gate terminal, and a wide bandgap bipolar transistor having a base, a collector, and an emitter terminal. The emitter terminal of the bipolar transistor is directly coupled to the anode terminal of the thyristor such that the bipolar transistor and the thyristor are connected in series. The bipolar transistor and the thyristor define a wide bandgap bipolar power switching device that is configured to switch between a nonconducting state and a conducting state that allows current flow between a first main terminal corresponding to the collector terminal of the bipolar transistor and a second main terminal corresponding to the cathode terminal of the thyristor responsive to application of a first control signal to the base terminal of the bipolar transistor and responsive to application of a second control signal to the gate terminal of the thyristor. Related control circuits are also discussed.

19 Claims, 3 Drawing Sheets

U.S. PATENT DOCUMENTS

| | | | |
|---|---|---|---|
| 4,927,772 A | 5/1990 | Arthur et al. |
| 4,945,394 A | 7/1990 | Palmour et al. |
| 4,946,547 A | 8/1990 | Palmour et al. |
| 5,011,549 A | 4/1991 | Kong et al. |
| 5,028,977 A | 7/1991 | Kenneth et al. |
| 5,032,888 A | 7/1991 | Seki |
| 5,111,253 A | 5/1992 | Korman et al. |
| 5,155,289 A | 10/1992 | Bowles |
| 5,170,231 A | 12/1992 | Fujii et al. |
| 5,170,455 A | 12/1992 | Goossen et al. |
| 5,184,199 A | 2/1993 | Fujii et al. |
| 5,192,987 A | 3/1993 | Khan et al. |
| 5,200,022 A | 4/1993 | Kong et al. |
| 5,210,051 A | 5/1993 | Carter, Jr. |
| 5,270,554 A | 12/1993 | Palmour |
| 5,292,501 A | 3/1994 | Degenhardt et al. |
| 5,296,395 A | 3/1994 | Khan et al. |
| 5,348,895 A | 9/1994 | Smayling et al. |
| 5,371,383 A | 12/1994 | Miyata et al. |
| 5,384,270 A | 1/1995 | Ueno |
| 5,385,855 A | 1/1995 | Brown et al. |
| RE34,861 E | 2/1995 | Davis et al. |
| 5,393,993 A | 2/1995 | Edmond et al. |
| 5,393,999 A | 2/1995 | Malhi |
| 5,396,085 A | 3/1995 | Baliga |
| 5,459,107 A | 10/1995 | Palmour |
| 5,468,654 A | 11/1995 | Harada |
| 5,479,316 A | 12/1995 | Smrtic et al. |
| 5,488,236 A | 1/1996 | Baliga et al. |
| 5,506,421 A | 4/1996 | Palmour |
| 5,510,281 A | 4/1996 | Ghezzo et al. |
| 5,510,630 A | 4/1996 | Agarwal |
| 5,523,589 A | 6/1996 | Edmond et al. |
| 5,539,217 A | 7/1996 | Edmond et al. |
| 5,545,905 A | 8/1996 | Muraoka et al. |
| 5,587,870 A | 12/1996 | Anderson et al. |
| 5,629,531 A | 5/1997 | Palmour |
| 5,710,059 A | 1/1998 | Rottner |
| 5,726,463 A | 3/1998 | Brown et al. |
| 5,726,469 A | 3/1998 | Chen |
| 5,734,180 A | 3/1998 | Malhi |
| 5,739,564 A | 4/1998 | Kosa et al. |
| 5,763,905 A | 6/1998 | Harris |
| 5,776,837 A | 7/1998 | Palmour |
| 5,804,483 A | 9/1998 | Harris |
| 5,814,859 A | 9/1998 | Ghezzo et al. |
| 5,831,288 A | 11/1998 | Singh et al. |
| 5,837,572 A | 11/1998 | Gardner et al. |
| 5,851,908 A | 12/1998 | Harris et al. |
| 5,877,041 A | 3/1999 | Fuller |
| 5,877,045 A | 3/1999 | Kapoor |
| 5,885,870 A | 3/1999 | Maiti et al. |
| 5,914,500 A | 6/1999 | Bakowski et al. |
| 5,917,203 A | 6/1999 | Bhatnagar et al. |
| 5,939,763 A | 8/1999 | Hao et al. |
| 5,960,289 A | 9/1999 | Tsui et al. |
| 5,969,378 A | 10/1999 | Singh |
| 5,972,801 A | 10/1999 | Lipkin et al. |
| 5,976,936 A | 11/1999 | Miyajima et al. |
| 5,977,605 A | 11/1999 | Bakowsky et al. |
| 6,020,600 A | 2/2000 | Miyajima et al. |
| 6,025,233 A | 2/2000 | Terasawa |
| 6,025,608 A | 2/2000 | Harris et al. |
| 6,028,012 A | 2/2000 | Wang |
| 6,040,237 A | 3/2000 | Bakowski et al. |
| 6,048,766 A | 4/2000 | Gardner et al. |
| 6,054,352 A | 4/2000 | Ueno |
| 6,054,728 A | 4/2000 | Harada et al. |
| 6,063,698 A | 5/2000 | Tseng et al. |
| 6,083,814 A | 7/2000 | Nilsson |
| 6,096,607 A | 8/2000 | Ueno |
| 6,100,169 A | 8/2000 | Suvorov et al. |
| 6,104,043 A | 8/2000 | Hermansson et al. |
| 6,107,142 A | 8/2000 | Suvorov et al. |
| 6,117,735 A | 9/2000 | Ueno |
| 6,121,633 A | 9/2000 | Singh et al. |
| 6,133,587 A | 10/2000 | Takeuchi et al. |
| 6,136,727 A | 10/2000 | Ueno |
| 6,136,728 A | 10/2000 | Wang |
| 6,165,822 A | 12/2000 | Okuno et al. |
| 6,180,958 B1 | 1/2001 | Cooper, Jr. |
| 6,190,973 B1 | 2/2001 | Berg et al. |
| 6,204,135 B1 | 3/2001 | Peters et al. |
| 6,204,203 B1 | 3/2001 | Narwankar et al. |
| 6,211,035 B1 | 4/2001 | Moise et al. |
| 6,218,254 B1 | 4/2001 | Singh et al. |
| 6,218,680 B1 | 4/2001 | Carter, Jr. et al. |
| 6,221,700 B1 | 4/2001 | Okuno et al. |
| 6,228,720 B1 | 5/2001 | Kitabatake et al. |
| 6,238,967 B1 | 5/2001 | Shiho et al. |
| 6,239,463 B1 | 5/2001 | Williams et al. |
| 6,239,466 B1 | 5/2001 | Elasser et al. |
| 6,246,076 B1 | 6/2001 | Lipkin et al. |
| 6,297,100 B1 | 10/2001 | Kumar et al. |
| 6,297,172 B1 | 10/2001 | Kashiwagi |
| 6,303,508 B1 | 10/2001 | Alok |
| 6,316,791 B1 | 11/2001 | Schorner et al. |
| 6,316,793 B1 | 11/2001 | Sheppard et al. |
| 6,329,675 B2 | 12/2001 | Singh et al. |
| 6,344,663 B1 | 2/2002 | Slater, Jr. et al. |
| 6,365,932 B1 | 4/2002 | Kouno et al. |
| 6,388,271 B1 | 5/2002 | Mitlehner et al. |
| 6,399,996 B1 | 6/2002 | Chang et al. |
| 6,420,225 B1 | 7/2002 | Chang et al. |
| 6,429,041 B1 | 8/2002 | Ryu et al. |
| 6,448,160 B1 | 9/2002 | Chang et al. |
| 6,455,892 B1 | 9/2002 | Okuno et al. |
| 6,475,889 B1 | 11/2002 | Ring |
| 6,515,303 B2 | 2/2003 | Ring |
| 6,524,900 B2 | 2/2003 | Dahlqvist et al. |
| 6,548,333 B2 | 4/2003 | Smith |
| 6,551,865 B2 | 4/2003 | Kumar et al. |
| 6,573,534 B1 | 6/2003 | Kumar et al. |
| 6,593,620 B1 | 7/2003 | Hshieh et al. |
| 6,610,366 B2 | 8/2003 | Lipkin |
| 6,627,539 B1 | 9/2003 | Zhao et al. |
| 6,649,497 B2 | 11/2003 | Ring |
| 6,653,659 B2 | 11/2003 | Ryu et al. |
| 6,696,705 B1 | 2/2004 | Barthelmess et al. |
| 6,703,642 B1 | 3/2004 | Shah |
| 6,743,703 B2 | 6/2004 | Rodov et al. |
| 6,861,723 B2 | 3/2005 | Willmeroth |
| 6,936,850 B2 | 8/2005 | Friedrichs et al. |
| 6,946,739 B2 | 9/2005 | Ring |
| 6,956,238 B2 | 10/2005 | Ryu et al. |
| 6,979,863 B2 | 12/2005 | Ryu |
| 7,026,650 B2 | 4/2006 | Ryu et al. |
| 7,074,643 B2 | 7/2006 | Ryu |
| 7,118,970 B2 | 10/2006 | Das et al. |
| 7,125,786 B2 | 10/2006 | Ring et al. |
| 7,253,031 B2 | 8/2007 | Takahashi et al. |
| 7,279,115 B1 | 10/2007 | Sumakeris |
| 7,304,363 B1 | 12/2007 | Shah |
| 7,365,363 B2 | 4/2008 | Kojima et al. |
| 7,381,992 B2 | 6/2008 | Ryu |
| 7,528,040 B2 | 5/2009 | Das et al. |
| 7,544,963 B2 | 6/2009 | Saxler |
| 7,548,112 B2 | 6/2009 | Sheppard |
| 7,649,213 B2 | 1/2010 | Hatakeyama et al. |
| 2001/0055852 A1 | 12/2001 | Moise et al. |
| 2002/0030191 A1 | 3/2002 | Das et al. |
| 2002/0038891 A1 | 4/2002 | Ryu et al. |
| 2002/0047125 A1 | 4/2002 | Fukuda et al. |
| 2002/0072247 A1 | 6/2002 | Lipkin et al. |
| 2002/0102358 A1 | 8/2002 | Das et al. |
| 2002/0121641 A1 | 9/2002 | Alok et al. |
| 2002/0125482 A1 | 9/2002 | Friedrichs et al. |
| 2002/0125541 A1 | 9/2002 | Korec et al. |
| 2003/0025175 A1 | 2/2003 | Asano et al. |
| 2003/0107041 A1 | 6/2003 | Tanimoto et al. |
| 2003/0137010 A1 | 7/2003 | Friedrichs et al. |
| 2003/0178672 A1 | 9/2003 | Hatakeyama et al. |
| 2003/0201455 A1 | 10/2003 | Takahashi et al. |
| 2004/0016929 A1 | 1/2004 | Nakatsuka et al. |
| 2004/0082116 A1 | 4/2004 | Kub et al. |
| 2004/0183079 A1 | 9/2004 | Kaneko et al. |
| 2004/0211980 A1 | 10/2004 | Ryu |

| | | |
|---|---|---|
| 2004/0212011 A1 | 10/2004 | Ryu |
| 2004/0256659 A1 | 12/2004 | Kim et al. |
| 2004/0259339 A1 | 12/2004 | Tanabe et al. |
| 2005/0012143 A1 | 1/2005 | Tanaka et al. |
| 2005/0104072 A1 | 5/2005 | Slater, Jr. et al. |
| 2005/0139936 A1 | 6/2005 | Li |
| 2005/0151138 A1 | 7/2005 | Slater, Jr. et al. |
| 2005/0181536 A1 | 8/2005 | Tsuji |
| 2005/0275055 A1 | 12/2005 | Parthasarathy et al. |
| 2006/0011128 A1 | 1/2006 | Ellison et al. |
| 2006/0060884 A1 | 3/2006 | Ohyanagi et al. |
| 2006/0086997 A1 | 4/2006 | Kanaya et al. |
| 2006/0211210 A1 | 9/2006 | Bhat et al. |
| 2006/0244010 A1 | 11/2006 | Saxler |
| 2006/0255423 A1 | 11/2006 | Ryu et al. |
| 2006/0261347 A1 | 11/2006 | Ryu et al. |
| 2006/0261876 A1 | 11/2006 | Agarwal et al. |
| 2006/0267021 A1 | 11/2006 | Rowland et al. |
| 2007/0066039 A1 | 3/2007 | Agarwal et al. |
| 2007/0120148 A1 | 5/2007 | Nogome |
| 2007/0164321 A1 | 7/2007 | Sheppard |
| 2007/0241427 A1 | 10/2007 | Mochizuki et al. |
| 2008/0001158 A1 | 1/2008 | Das et al. |
| 2008/0006848 A1 | 1/2008 | Chen et al. |
| 2008/0029838 A1 | 2/2008 | Zhang et al. |
| 2008/0105949 A1 | 5/2008 | Zhang et al. |
| 2008/0191304 A1 | 8/2008 | Zhang et al. |
| 2008/0230787 A1 | 9/2008 | Suziki et al. |
| 2008/0251793 A1 | 10/2008 | Mazzola et al. |
| 2008/0277669 A1 | 11/2008 | Okuno et al. |
| 2009/0121319 A1 | 5/2009 | Zhang et al. |

FOREIGN PATENT DOCUMENTS

| | | |
|---|---|---|
| DE | 198 09 554 | 9/1998 |
| DE | 198 32 329 A1 | 2/1999 |
| DE | 19900171 | 7/1999 |
| DE | 10036208 A1 | 2/2002 |
| EP | 0 176 778 A2 | 4/1986 |
| EP | 0 372 412 A1 | 6/1990 |
| EP | 0 389 863 A1 | 10/1990 |
| EP | 0637069 A1 | 2/1995 |
| EP | 0735591 A1 | 10/1996 |
| EP | 0837508 A2 | 4/1998 |
| EP | 0 865 085 A1 | 9/1998 |
| EP | 1 058 317 A2 | 12/2000 |
| EP | 1 361 614 A1 | 11/2003 |
| EP | 1 460 681 A2 | 9/2004 |
| EP | 1 503 425 A2 | 2/2005 |
| EP | 1 693 896 A1 | 8/2006 |
| EP | 1 806 787 A1 | 7/2007 |
| EP | 1 845 561 A2 | 10/2007 |
| EP | 2 015 364 | 1/2009 |
| JP | 60-240158 | 11/1985 |
| JP | 01117363 | 5/1989 |
| JP | 03034466 | 2/1991 |
| JP | 03157974 | 7/1991 |
| JP | 3-225870 | 10/1991 |
| JP | 08264766 | 10/1996 |
| JP | 09205202 | 8/1997 |
| JP | 11191559 | 7/1999 |
| JP | 11238742 A | 8/1999 |
| JP | 11261061 A | 9/1999 |
| JP | 11266017 A | 9/1999 |
| JP | 11274487 | 10/1999 |
| JP | 2000049167 | 2/2000 |
| JP | 2000082812 A | 3/2000 |
| JP | 2000-252478 A | 9/2000 |
| JP | 02000252461 A | 9/2000 |
| JP | 2000106371 A | 4/2001 |
| JP | 2002-314099 | 10/2002 |
| WO | WO 96/03774 | 2/1996 |
| WO | WO 97/08754 | 3/1997 |
| WO | WO 97/17730 | 5/1997 |
| WO | WO 97/39485 A1 | 10/1997 |
| WO | WO 98/02916 | 1/1998 |
| WO | WO 98/02924 A2 | 1/1998 |
| WO | WO 98/08259 | 2/1998 |
| WO | WO 98/32178 | 7/1998 |
| WO | WO99/63591 A1 | 12/1999 |
| WO | WO 00/13236 A3 | 3/2000 |
| WO | WO 2004/020706 A1 | 3/2001 |
| WO | WO 01/78134 A1 | 10/2001 |
| WO | WO 2004/079789 A2 | 9/2004 |
| WO | WO 2005/020308 A1 | 3/2005 |
| WO | WO 2006/135031 A2 | 12/2006 |
| WO | WO 2007/040710 A1 | 4/2007 |

OTHER PUBLICATIONS

Invitation to Pay Additional Fees for PCT/US2010/025053 mailed on May 3, 2010.

International Search Report and Written Opinion for PCT/US2010/025053 mailed on Jul. 2, 2010.

"Insulated-gate bipolar transistor." *Wikipedia, the Free Encyclopedia*. Web. Jun. 21, 2010. http://en.wikipedia.org.

A.K. Agarwal, J.B. Casady, L.B. Rowland, W.F. Valek, and C.D. Brandt, "1400 V 4H-SiC Power MOSFET's," Materials Science Forum vols. 264-268, pp. 989-992, 1998.

A.K. Agarwal, J.B. Casady, L.B. Rowland, W.F. Valek, M.H. White, and C.D. Brandt, "1.1 kV 4H-SiC Power UMOSFET's," *IEEE Electron Device Letters*, vol. 18, No. 12, pp. 586-588, Dec. 1997.

A.K. Agarwal, N.S. Saks, S.S. Mani, V.S. Hegde and P.A. Sanger, "Investigation of Lateral RESURF, 6H-SiC MOSFET's," *Materials Science Forum*, vols. 338-342, pp. 1307-1310, 2000.

A.K. Agarwal, S. Seshadri, and L.B. Rowland, "Temperature Dependence of Fowler-Nordheim Current in 6H-and 4H-SiC MOS Capacitors," *IEEE Electron Device letters*, vol. 18, No. 12, Dec. 1997, pp. 592-594.

A.V. Suvorov, L.A. Lipkin, G.M. Johnson, R. Singh and J.W. Palmour, "4H-SiC Self-Aligned Implant Diffused Structure of Power DMOSFET's," *Materials Science Forum* vols. 338-342, pp. 1275-1278, 2000.

Agarwai et al., "A Critical Look at the Performance Advantages and Limitations of 4H-SiC Power UNMOSFET Structures," *1996 IEEE ISPSD and IC's Proc.*, May 20-23, 1996, pp. 119-122.

Asano et al., "Dynamic Characteristics of 6.2kV High Voltage 4H-SiC on Diode with Low Loss", Transactioins of the Institute of Electrical Engineers of Japan, Part D Inst. Electr. Eng. Japan, vol. 123D, No. 5, May 2003, pp. 623-627, XP8124184.

Ayalew, T., "Dissertation of Tesfaye Ayalew", Section 4.4.3.1 MPS Diode Structure, *SiC Semiconductor Devices Technology, Modeling, and Simulation*, 2006.

Baliga "Insulated Gate Bipolar Transistor" *Power Semiconductor Devices* PWS Publishing Company, Boston, MA. 426-502 (1996).

Baliga "Power MOSFET" *Power Semiconductor Devices*. PWS Publishing Company, Boston, MA 335-425 (1996).

Baliga, Power Semiconductor Devices, Chapter 7, PWS Publishing, 1996.

Buchner et al., "Laser Recrystalization of Polysilicon for Improved Device Quality", Springer Proceedings in Physics, vol. 35, Polycrystalline Semiconductors, pp. 289-294.

Capano, M.S., et al., Ionization Energies and Electron Mobilities in Phosphorous— and Nitrogen-Implanted 4H-Silicon Carbide, IEEE ICSCRM Conference 1999, Research Triangle Park, North Carolina (Oct. 10-13, 1999).

Chakraborty et al., "Interface Properties of $N_2O$ annealed $SiO_2$/SiC System," *Proceedings IEEE Hong Kong Electron Devices Meeting*. Jun. 24, 2000, pp. 108-111.

Chang et al. "Observation of a Non-stoichiometric Layer at the Silicon Dioxide—Silicon Carbide Interface: Effect of Oxidation Temperature and Post-Oxidation Processing Conditions," *Mat. Res. Soc. Symp. Proc.* vol. 640, 2001.

Chen et al., "Theoretical Analysis of Current Crowding Effect in Metal/AlGaN/GaN Schottky Diodes and Its Reduction by Using Polysilicon in Anode," Chin. Phys. Lett., vol. 24, No. 7, (2007) pp. 2112-2114.

Chinese Office Action dated Jan. 22, 2010, corresponding to Chinese Patent Application No. 200780029460.5, 7 pages.

Cho et al "Improvement of charge trapping by hydrogen post-oxidation annealing in gate oxide of 4H-SiC methel-oxide-semiconductor capacitors," *Applied Physics Letters*. vol. 77, No. 8, pp. 1215-1257 (Aug. 21, 2000).

Chung et al. "Effects of anneals in ammonia on the interface trap density near athe band edges in 4H-silicon carbide metal-oxide-semiconductor capacitors," *Applied Physics Letters*. vol. 77, Nov. 27, 2000, pp. 3601-3603.

Chung et al., "The Effect of Si:C Source Ratio on SiO$_2$/SiC Interface State Density for Nitrogen Doped 4H and 6H-SiC," *Materials Science Forum*. (2000) vols. 338-342, pp. 1097-1100.

International Search Report and Written Opinion for corresponding International Application No. PCT/US2004/004982, dated Jul. 22, 2004.

International Search Report for PCT/US01/30715.

International Search Report for PCT/US01/42414, dated Apr. 23, 2002.

International Search Report for PCT/US02/11691 dated Dec. 4, 2002.

D. Alok, E. Arnold, and R. Egloff, "Process Dependence of Inversion Layer Mobility in 4H-SiC Devices,"*Materials Science Forum*, vols. 338-342, pp. 1077-1080, 2000.

Dahlquist et al. "A 2.8kV, Forward Drop JBS Diode wtih Low Leakage," *Materials Science Forum*, vols. 338-342, (2002) pp. 1179-1182.

Das, Mrinal K. Graduate thesis entitled, *Fundamental Studies of the Silicon Carbide MOS Structure*. Purdue University, 1999.

Dastidar, Sujoyita, A study of P-Type Activation in Silicon Carbide, Thesis (Purdue Universtiy, May 1998).

De Meo et al., "Thermal Oxidation of SiC in N$_2$O", *J. Electrochem. Soc.*, vol. 441, 1994, pp. L150-L152.

del Prado et al. "Full composition Range Silicon Oxynitride Films Deposited by ECR-PECVD at Room Temperatures," *Thin Solid Films*. vol. 343-344 (1999) p. 437-440.

Dimitrijev et al., "Nitridation of Silicon-Dioxide Films Grown on 6H Silicon Carbide", *IEEE Electronic Device Letters*, vol. 18, No. 5, May 5, 1997, pp. 175-177.

European Search Report for Corresponding EP patent application No. 09177558.5 dated Feb. 22, 2010.

European Search Report for corresponding EP patent application No. 09163424.6 dated Apr. 9, 2010.

European Search Report; Application No. EP07120038; Jun. 16, 2008.

Extended European Search Report (12 pages) corresponding to European Application No. 07112298; Dated Feb. 18, 2009.

Fisher, C.A. et al., "The performance of high-voltage field relieved Schottky barrier diodes", IEE Proceedings, vol. 132:6, Pt. 1, pp. 257-260 (Dec. 1985).

Fukuda et al. "Improvement of SiO$_2$/4H-SiC Interface Using High-Temperature Hydrogen Annealing at Low Pressure and Vacuum Annealing," *Jpn. J. Appl. Phys.* vol. 38, Apr. 1999, pp. 2306-2309.

Fukuda et al. "Improvement of SiO$_2$/4H-SiC Interface by Using High Temperature Hydrogen Annealing at 1000°C.," *Extended Abstracts of the International Conference on Solid State Devices and Materials*. Japan Society of Applied Physics, Tokyo, Japan, Sep. 1998.

G.Y. Chung, C.C. Tin, J.R. Williams, K. McDonald, M. Di Ventra, S.T. Pantelides, L.C. Feldman, and R.A. Weller, "Effect of nitric oxide annealing on the interface trap densities near the band edges in the 4H polytype of silicon carbide," *Applied Physics Letters*, vol. 76, No. 13, pp. 1713-1715, Mar. 2000.

G.Y. Chung, C.C. Tin, J.R. Williams, K. McDonald, R.K. Chanana, R.A. Weller, S.T. Pantelides, L.C. Feldman, O.W. Holland, M.K. Das, and J.W. Palmour, "Improved Inversion Channel Mobility for 4H-SiC MOSFETs Following High Temperature Anneals in Nitric Oxide," *IEEE Electron Device Letters*, vol. 22, No. 4, Apr. 2001.

H.F. Li, S. Dimitrijev, H.B. Harrison, D. Sweatman, P.T. Tanner. "Improving SiO$_2$ Grown on P-Type 4H-SiC by NO Annealing," *Materials Science Forum*. vols. 264-268 (1998) pp. 869-872.

http://www.elec.gla.ac.uk; *The Insulated Gate Bipolar Transistor (IGBT)*; Feb. 14, 2007.

Hubel, K, "Hybrid design improves diode robustness and boosts efficiency," Compoundsemiconductor.net, 2006.

Hull et al., "Drift-Free 10-kV, 20-A 4H-SiC PiN Diodes," Journal of Electronic Materials, vol. 34, No. 4, 2005, pp. 341-344.

International Preliminary Report on Patentability (9 pages) corresponding to International Application No. PCT/US2007/010192; Mailing Date: Sep. 23, 2008

International Search Report and Written Opinion (13 pages) corresponding to International Application No. PCT/US2008/010538; Mailing Date: Dec. 22, 2008.

International Search Report and Written Opinion (14 pages) corresponding to International Application No. PCT/US2010/020071; Mailing Date: Mar. 26, 2010.

International Search Report and Written Opinion (14 pages) corresponding to International Application No. PCT/US2009/065251; Mailing Date: Jun. 1, 2010.

International Search Report and Written Opinion (16 pages) corresponding to International Application No. PCT/US2009/003089; Mailing Date: Aug. 20, 2009.

International Search Report and Written Opinion for PCT/US2007/014139; Feb. 4, 2008.

International Search Report and Written Opinion, International Application No. PCT/US2009/000734, Apr. 23, 2009.

International Search Report, PCT/US2008/008574, Sep. 26, 2008.

Invitation to Pay Additional Fees for PCT/US2007/010192; Oct. 29, 2007.

J. Tan, J.A. Cooper, Jr., and Mr. R. Melloch, "High-Voltage Accumulation-Layer UMOSFETs in 4H-SiC," *IEEE Electron Device Letters*, vol. 19, No. 12, pp. 487-489, Dec. 1998.

J.B. Casady, A.K. Agarwal, L.B. Rowland, W.F. Valek, and C.D. Brandt, "900 V DMOS and 1100 V UMOS 4H-SiC Power FETs," *IEEE Device Research Conference*, Ft. Collins, CO Jun. 23-24, 1997.

J.N. Shenoy, J.A. Cooper and M.R. Meelock, "High-Voltage Double-Implanted Power MOSFETs in 6H-SiC," *IEEE Electron Device Letters*, vol. 18, No. 3, pp. 93-95, Mar. 1997.

J.T. Richmond, S. Ryu, A.K. Agarwal and J.W. Palmour, "Hybrid 4H-SiC MOS Gated Transistor (MGT)" (admitted prior art).

Jamet, et al. "Physical properties of N$_2$O and NO-nitride gate oxides grown on 4H SiC," *Applied Physics Letters*. vol. 79, No. 3, Jul. 16, 2001, pp. 323-325.

K. Ueno and Tadaaki Oikawa, "Counter-Doped MOSFET's of 4H-SiC," *IEEE Electron Device Letters*, vol. 20, No. 12, pp. 624-626, Dec. 1999.

K. Ueno, R. Asai, and T. Tsuji. "4H-SiC MOSFET's Utilizing the H2 Surface Cleaning Technique." *IEEE Electron Device Letters*, vol. 19, No. 17, Jul. 1998, pp. 244-246.

Katsunori Ueno, Tatsue Urushidani, Kouicki Hahimoto, and Yasukazu Seki. "The Guard-Ring Termination for the High-Voltage SiC Schottky Barrier Diodes". *IEEE Electron Device Letters*. vol. 16, No. 7, Jul. 1995, pp. 331-332.

Kinoshita et al., "Guard Ring Assisted RESURF: A New Termination Structure Providing Stable and High Breakdown Voltage for SiC Power Devices," Tech. Digest of ISPSD '02, pp. 253-256.

Kobayashi et al. "Dielectric Breakdown and Current Conduction of Oxide/Nitride/Oxide Multi-Layer Structures," 1990 *IEEE Symposium of VLSI Technology*. pp. 119-120.

Krishnaswami et al., "High Temperature characterization of 4H-SiC bipolar junction transistors", Materials Science Forum, Aedermannsfdorf, CH, vol. 527-529, Jan. 1, 2006, pp. 1437-1440, XP009138720, ISSN: 0255-5476.

L.A. Lipkin and J.W. Palmour, "Low interface state density oxides on p-type SiC," Materials Science Forum vols. 264-268, pp. 853-856, 1998.

Lai et al., "Interface Properties of N$_2$O-Annealed NH$_3$-Treated 6H SiC MOS Capacitor," *Proc. 1999 IEEE Hong Kong Electron Devices Meeting*, Jun. 26, 1999, pp. 46-49.

Leonhard et al. "Long term stability of gate-oxides on n- and p-type silicon crabide studies by charge injection techniques," *Materials Science Engineering*, vol. 46, No. 1-3, Apr. 1997, pp. 263-266.

Levinshtein et al., "On the homogeneity of the turn-on process in high voltage 4H-SiC thyristors", Solid State Electronics, vol. 49, No. 2, Feb. 1, 2005, pp. 233-237, XP004645018 Elsevier Science Publishes, Barking (GB) ISSN: 0038-1101.

Lipkin et al. "Insulator Investigation on SiC for Improved Reliability,"*IEEE Transactions on Electron Devices*. vol. 46, No. 3, Mar. 1999, pp. 525-532.

Lipkin et al. "Challenges and State-of-the-Art Oxides in SiC," *Mat. Res. Soc. Symp. Proc.* vol. 640, 2001, pp. 27-29.

Losee et al., "Degraded Blocking Performance of 4H-SiC Rectifiers Under High dV/dt Conditions", Proceedings of 17$^{th}$ International Symposium on Power Semiconductor Devices & IC's, 4 pages (May 23-26, 2005). XP010820730.

Lossee et al., "High-Voltage 4H-SiC PiN Rectifiers wtih Single-Implant, Multi-Zone JTE Termination", Power Semiconductor Devices on ICs, 2004 Proceedings, ISPSB '04. The 16$^{5h}$ International Symposium on Kitakyushu Int. Conf. Center, Japan May 24-27, 2004, Piscataway, NJ, USA, IEEE, May 24, 2004, pp. 301-304, XP010723398.

M. Das et al., "A 13 kV 4H-SiC N-Channel IGBT with Low Rdiff, on and Fast Switching" presented at: International Conference on Silicon Carbide and Related Materials )ICSCRM), Otsu, Japan, Oct. 14-19, 2007.

M. K. Das, L.A. Lipkin, J.W. Palmour, G.Y. Chung, J.R. Williams, K. McDonald, and L.C. Feldman, "High Mobility 4H-SiC Inversion Mode MOSFETs Using Thermally Grown, NO Annealed $SiO_2$," *IEEE Device Research Conference*, Denver, CO Jun. 19-21, 2000.

M.A. Capano, S. Ryu, J.A. Cooper, Jr., M.R. Melloch, K. Rottner, S. Karlsson, N. Nordell, A. Powell, and D.E. Walker, Jr., "Surface Roughening in Ion Implanted 4H-Silicon Carbide," *Journal of Electronic Materials*, vol. 28, No. 3, pp. 214-218, Mar. 1999.

M.K. Das, J.A. Cooper, Jr., M.R. Melloch, and M.A. Capano, "Inversion Channel Mobility 4H- and 6H-SiC MOSFETs," *IEEE Semiconductor Interface Specialists Conference*, San Diego, CA, Dec. 3-5, 1998.

Ma et al., "Fixed and trapped charges at oxide-nitride-oxide heterostructure interfaces formed by remote plasma enhanced chemical vapor deposition," *J. Vac. Sci. Technol. B*. vol. 11, No. 4, Jul./Aug. 1993, pp. 1533-1540.

Mondal et al. "An Integrated 500-V Power DSMOSFET/Antiparallel Rectifier Device with Improved Diode Reverse Recovery Characteristics," *IEEE Electron Device Letters*, vol. 23, No. 9, Sep. 2002, pp. 562-564.

Motorola Power MOSFET Transistor Databook, 4th edition. Motorola, INc., 1989, pp. 2-5-4-2-5-7.

Mutin, P. Herbert, "Control of the Composition and Structure of Silicon Oxycarbide and Oxynitride Glasses Derived from Polysiloxane Precursors," *Journal of Sol-Gel Science and Technology*. vol. 14 (1999) pp. 27-38.

Myer-Ward et al. "Turning of Basal Plane Dislocations During Epitaxial Growth on 4 off-axis 4h SiC" 7$^{th}$ *European Conference on Silicon Carbide and Related Materials*, Barcelona-Spain, Sep. 7-11, 2008 retrieved from http://ecscrm08.com/invited_presentations.html , retrieved Jul. 1, 2009.

Notification of Transmittal of the International Search Report and the Written Opinion of the International Searching Authority, or the Declaraton, International Search Report, Written Opinion of the International Searching Authority, PCT/US2010/026632, Date of Mailing: Oct. 8, 2010, 16 pages.

Notification of Transmittal of the International Search Report and the Written Opinion of the International Searching Authority, or the Declaration, International Search Report, Written Opinion of the International Searching Authority, PCT/US2010/035713, Date of Mailing: Jul. 27, 2010, 14 pages.

Notification of Transmittal of the International Search Report and the Written Opinion of the International Searching Authority, or the Declaration, International Search Report, Written Opinion of the International Searching Authroity, PCT/US2010/042075, Date of Mailing: Sep. 24, 2010, 15 pages.

Notification of Transmittal of the Internationl Search Report and the Written Opinion of the International Searching Authority, or the Delcaration, PCT/US2010/028612, Jun. 17, 2010.

Notification of Transmittal of the International Search Report and the Written Opinion of the International Searching Authority, or the Delcaration; International Search Report; Written Opinion of the International Searching Authorioty, PCT/US2008/004239, Mar. 2, 2009.

P.J. Tobin, Y. Okada, S.A. Ajuria, V. Lakhotia, W.A. Feil, and R. I. Hedge, "Furnace formation of silicon oxynitride thin dielectrics in nitrous oxide ($N_2O$): The role of nitric oxide (NO)." *Journal of Applied Physics*. vol. 75, No. 3, Feb. 1, 1994, pp. 1811-1817.

P. M. Shenoy and B.J. Baliga, "The Planar 6H-SiC ACCUFET: A New High-Voltage Power MOSFET Structure," *IEEE Electron Device Letters*, vol. 18, No. 12, pp. 589-591, Dec. 1997.

P.T. Lai, Supratic Chakraborty, C.L. Chan and Y.C. Cheng, "Effects of nitridation and annealing of interface properties of thermally oxidized $SiO_2$/SiC metal-oxide-semiconductor system," *Applied Physics Letters*, vol. 76, No. 25, pp. 3744-3746, Jun. 2000.

Palmour et al. "SiC Device Technology: Remaining Issues," Diamond and Related Materials. vol. 6, 1997, pp. 1400-1404.

Palmour J: "Silicon Carbide npnp Thyristors", NASA Technical Briefs—Electronics and Computers, Dec. 1, 2000, John H. Glenn Research Center, Cleveland, Ohio (US); XP-002567723, http://www.techbriefs.com/component/content/article/7031-lew-16750?mtpl=component&print=1&page= retrieved on Feb. 10, 2010.

Panknin et al., "Electrical and microstructrual properties of highly boron-implantation doped 6H-SiC", Journal of Applied Physics 89:6, pp. 3162-3167 (Mar. 15, 2001).

Pantelides et al., "Atomic-Scale Engineering of the SiC-SiO2 Interface," *Materials Science Forum*. (2000) vols. 338-342, pp. 1133-1136.

Patel, R., et al., Phosphorous-Implanted High-Voltage N.sup.+ P 4H-SiC Junction Rectifiers, Proceedings of 1998 International Symposium on Poer Semiconductor Devices & ICs, pp. 387-390 (Kyoto).

Q. Zhang et al. "12 kV 4H-SiC p-IGBTs with Record Low Specific On-Resistance" presented at: International Conference on Silicon Carbide and Related Materials (ICSCRM), Otsu, Japan, Oct. 14-19, 2007.

R. Schörner, P. Friedrichs, D. Peters, and D. Stephani, "Significantly Improved Performance of MOSFETs on Silicon Carbide Using the 15R-SiC Polytype," *IEEE Electron Device Letters*, vol. 20, No. 5, pp. 241-244, May 1999.

R. Schörner, P. Friedrichs, D. Peters, H. Mitlehner, B. Weis, and D. Stephani, "Rugged Power MOSFETs in 6H-SiC wtih Blocking Capability up to 1800 V," *Materials Science Forum* vols. 338-342, pp. 1295-1298, 2000.

Ranbir Singh, Sei-Hyung Ryu and John W. Palmour, "High Temperature, High Current, 4H-SiC Accu-DMOSFET," Materials Science Forum vols. 338-342, pp. 1271-1274, 2000.

Rao et al. "Al and N Ion Implantations in 6H-SiC," Silicon Carbide and Related Materials. 1995 Conf, Kyoto, Japan. Published 1996.

Rao et al. "P-N Junction Formation in 6H-SiC by Acceptor Implantation into N-Type Substrate," Nuclear Instruments and Methods in Physics Research B. vol. 106, 1995, pp. 333-338.

Rao et al. "Silane overpressure post-implant annealing of A1 dopants in SiC: Cold wall CVD apparatus" *Applied Surface Science* 252: 3837-3842 (2006).

Rao, "Maturing ion-implantation technology and its device applications in SiC", *Solid State Electronics* 47:2, pp. 213-222, Elsevier Science Publishers (Feb. 2003).

Ryu et al. Article and Presentation: "27 m$\Omega$-cm$^2$, 1.6 kV Power DiMOSFETs in 4H-SiC," *Proceedings of the 14 International Symposium on Power Semiconductor Devices & ICs* 2002, Jun. 4-7, 2002, Santa Fe, NM.

S. Sridevan and B. Jayant Baliga, "Lateral N-Channel Inversion Mode 4H-SiC MOSFETs," *IEEE Electron Device Letters*, vol. 19, No. 7, pp. 228-230, Jul. 1998.

S. Sridevan, P.K. McLarty, and B.J. Baliga, "On the Presence of Aluminum in Thermally Grown Oxides on 6H-Silicon Carbide," *IEEE Electron Device Letters*, vol. 17, No. 3, pp. 136-138, Mar. 1996.

S.M. Sze Semiconductor Devices, Physics and Technology. 2$^{nd}$ Edition, © 2002 John Wiley and Sons, p. 130.

S.T. Pantelides, "Atomic Scale Engineering of SiC Dielectric Interfaces," DARPA/MTO High Power and ONR Power Switching MURI Reviews, Rosslyn, VA, Aug. 10-12, 1999.

Senzaki et al.; *Effects of Pyrogenic Reoxidation Annealing on Inversion Channel Mobility of 4H-SiC Metal-Oxide-Semiconductor Field-Effect Transistor Fabricated on (1120) Face*; Japanese Journal of Applied Physics, Japan Society of Applied Physics, Tokyo, JP; vol. 40, No. 11B, Part 2: Nov. 2001, pp. L1201-L1203.

Singh, R. and J.W. Palmour, "Planer Terminations in 4H-SiC Schottky Diodes with Low Leakage and High Yields," IEEE International Symposium on Power Semiconductor Devices and ICs, 1997, pp. 157-160.

Stengl et al., "Variation of Lateral Doping—A New Concept to Avoid High Voltage Breakdown of Planar Junctions", International Electron Devices Meeting; Washington, Dec. 1-4, 1985; pp. 154-157, XP002013050.

Stengl et al., Variation of Lateral Doping as a Field Terminator for High-Voltage Power Devices, IEEE Transactions on Electron Devices; vol. ED-33, No. 3, Mar. 1986, pp. 426-428, XP000836911.

Streetman, "Bipolar Junction Transistors" *Solid State Electronic Devices*. Prentice Hall, Englewood Cliffs, NJ. 228-284 (1980).

Sugawara et al., "3.6 kV 4H-SiC JBS Diodes with Low RonS". Materials Science Forum, vols. 338-342:2, pp. 1183-1186 (2002). XP-000944901.

Sundaresan et al., "Ultra-low resistivity Al+ implanted 4H-SiC obtained by microwave annealing and a protective graphite cap", *Solid-State Electronics* vol. 52, 2008, pp. 140-145, XP022360431.

Suzuki et al. "Effect of Post-oxidation-annealing in Hydrogen on $SiO_2$/4H-SiC Interface," *Materials Science Forum*, vols. 338-342 (2000) 1073-6.

Sze, S.M. *Physics of Semiconductor Devices*, John Wiley & Sons, p. 383-390, 1981.

Thomas et al., "Annealing of Ion Implantation Damage in SiC Using a Graphite Mask", Material Research Society Symposium Y Proceedings vol. 572, Spring 1999, pp. 45-50.

Treu et al. "A Surge Current Stable and Avalanche Rugged SiC Merged pn Schottky Diode Blocking 600V Especially Suited for PFC Applications" *Materials Science Forum* vols. 527-529; 1155-1158 (2006).

U.S. Appl. No. 11/711,383, filed Feb. 27, 2007, Zhang.
U.S. Appl. No. 11/740,687, filed Apr. 26, 2007, Das et al.
U.S. Appl. No. 10/422,130.
U.S. Appl. No. 60/294,307.
U.S. Appl. No. 60/435,212.

V.R. Vathulya and M.H. White, "Characterization of Channel Mobility on Implanted SiC Determine Polytype Suitability for the Power DIMOS Structure," *Electronic Materials Conference*, Santa Barbara, CA, Jun. 30-Jul. 2, 1999.

V.R. Vathulya, H. Shang, and M.H. White, "A Novel 6H-SiC Power DMOSFET with Implanted P-Well Spacer," *IEEE ELectronic Device Letters*, vol. 20, No. 7, Jul. 1999, pp. 354-356.

V.V. Afanasev, M. Bassler, G. Pensl, and M. Schulz, "Intrinsic SiC/$SiO_2$ Interface States," *Phy. Stat. Sol.* (a), vol. 162, pp. 321-337, 1997.

Vassilevski et al., "High Voltage Silicon Carbide Schottky Diodes with Single Zone Junction Termination Extension", Materials Science Forum, 2007 Trans Tech Publications, vols. 556-557 (2007) pp. 873-876, XP8124186.

Vassilevski et al., "Protection of selectively implanted and patterned silicon carbide sufaces with graphite capping layer during post-implantation annealing," Institute of Physics Publishing, Semicond. Sci. Technol. 20 (2005) 271-278.

Wang et al. "High Temperature Characteristics of High-Quality SiC MIS Capacitors with O/N/O Gate Dielectric," *IEEE Transactions on Electron Devices*. vol. 47, No. 2, Feb. 2000, pp. 458-462.

Williams et al. "Passivation of the 4H-SiC/$SiO_2$ Interface with Nitric Oxide," *Materials Science Forum*. vols. 389-393 (2002), pp. 967-972.

Xu et al. "Improved Performance and Reliability of $N_2$O-Grown Oxynitride on 6H-SiH," *IEEE Electron Device Letters* vol. 21, No. 6, Jun. 2000, p. 298-300.

Y. Li et al., "High Voltage (3 kV) UMOSFETs in 4H-SiC," *Transactions on Electroni Devices*, vol. 49, No. 6, Jun. 2002.

Y. Wang, C. Weitzel, and M. Bhatnagar, "Accumulation-Mode SiC Power MOSFET Design Issues," *Materials Science Forum*, vols. 338-342, pp. 1287-1290.

Zhang et al., "A 10-kV Monolithic Darlington Transistor with βforced of 336 in 4H-SiC," IEEE Electron Device Letters, vol. 30, No. 2, pp. 142-144, XP011240662.

Zhang et al.; *Design and Farbrications of High Voltage IGBTs on 4H-SiC*; 2006 IEEE Proceedings of the 18th International Symposium on Power Semiconductor Devices & ICs, Naples, Italy, Jun. 4-8, 2006, pp. 1-4.

Yilmaz, "Optimization and Surface Charge Sensitivity of High Voltage Blocking Structures with Shallow Junctions," IEEE Transactions on Electron Devices, vol. 38, No. 3, Jul. 1991, pp. 1666-1675.

International Preliminary Report on Patentability, PCT/US2010/025053 mailed Jul. 7, 2011.

* cited by examiner

WIDE BANDGAP BIPOLAR TURN-OFF THYRISTOR HAVING NON-NEGATIVE TEMPERATURE COEFFICIENT AND RELATED CONTROL CIRCUITS

STATEMENT OF GOVERNMENT INTEREST

The present invention was developed with Government support under Army Research Laboratory Contract No. W911NF-04-2-0022. The Government has certain rights in this invention.

FIELD

This invention relates to power semiconductor devices, and more particularly, to devices and circuits including power switching devices.

BACKGROUND

Power devices are widely used to carry large currents and support high voltages. Modern power devices are generally fabricated from monocrystalline silicon semiconductor material. One type of power device is the thyristor. A thyristor is a bistable power semiconductor device that can be switched from a nonconducting "off" state to a conducting "on" state, or vice versa. Power semiconductor devices, such as thyristors, high-power bipolar junction transistors ("HPBJT"), or power metal oxide semiconductor field effect transistors ("MOSFET"), are semiconductor devices capable of controlling or passing large amounts of current and blocking high voltages.

Thyristors are generally known and conventionally have three terminals: an anode, a cathode, and a gate. A thyristor may be activated to conduct current between its anode and cathode terminals when a current pulse is received at its gate terminal. More particularly, a thyristor may be turned on by applying a short current pulse across the gate and the cathode. Once the thyristor turns on, the gate may lose its control to turn off the device. The turn off may be achieved by applying a reverse voltage across the anode and the cathode. A specially designed gate turn-off thyristor ("GTO"), however, is typically turned off by a reverse gate pulse. The GTO thyristors generally start conduction by some trigger input and then behave as diodes thereafter.

A thyristor is a highly rugged device in terms of transient currents, di/dt and dv/dt capability. The forward voltage ($V_F$) drop in conventional silicon thyristors is about 1.5 V to 2 V, and for some higher power devices, about 3 V. Therefore, the thyristor can control or pass large amounts of current and effectively block high voltages (i.e., a voltage switch).

Two parameters of a thyristor are the built-in potential (which is a characteristic of the bandgap of the semiconductor material used to manufacture the thyristor) and the specific on-resistance (i.e., the electrical resistance across the anode and cathode of the device in the linear region when the device is turned on). The specific on-resistance for a thyristor is typically as small as possible so as to provide a large current per unit area for a given voltage applied to the thyristor. The lower the specific on-resistance, the lower the forward voltage ($V_F$) drop is for a given current rating. The minimum $V_F$ for a given semiconductor material is its built-in potential (voltage).

Some conventional thyristors may be manufactured in silicon (Si) or gallium arsenide (GaAs), such as a silicon controlled rectifier ("SCR"). Thyristors formed in Si or GaAs, however, may have certain performance limitations resulting from the Si or GaAs material itself, such as the minority carrier lifetime and the thickness of the drift region. The largest contributory factor to specific on-resistance is the resistance of the thick low-doped drift region of the thyristor. In a majority carrier device, such as a MOSFET, the specific on-resistance is determined by the doping concentration and the thickness of the lightly doped drift layer. In a minority carrier (or bipolar) device, carriers, both electrons and holes, are injected into this drift layer, and substantially reduces the specific on-resistance. This effect is referred to as conductivity modulation. As the rated voltage of a thyristor increases, typically the thickness of the drift region increases and the doping of the drift region decreases. For effective conductivity modulation, a very long minority carrier lifetime is required. At the same time, the amount of carriers stored in the drift layer increases because the volume of the drift layer is increased. Therefore, the time required to remove access carriers in the drift layer, which determines the switching times and frequencies, may increase dramatically for devices with higher blocking voltage ratings.

Development efforts in power devices have included the use of silicon carbide (SiC) devices for power devices. Silicon carbide has a wide bandgap, a lower dielectric constant, a high breakdown field strength, a high thermal conductivity, and a high saturation electron drift velocity relative to silicon. These characteristics may allow silicon carbide power devices to operate at higher temperatures, higher power levels and with lower specific on-resistance and higher switching frequency than conventional silicon-based power devices. A theoretical analysis of the superiority of silicon carbide devices over silicon devices is found in a publication by Bhatnagar et al. entitled "*Comparison of 6H-SiC, 3C-SiC and Si for Power Devices*", TREE Transactions on Electron Devices, Vol. 40, 1993, pp. 645-655.

SUMMARY

According to some embodiments of the present invention, an electronic device includes a wide bandgap thyristor having an anode, a cathode, and a gate terminal, and a wide bandgap bipolar transistor having a base, a collector, and an emitter terminal. The emitter terminal of the bipolar transistor is coupled to the anode terminal of the thyristor. The bipolar transistor and the thyristor define a hybrid or monolithic wide bandgap bipolar power switching device. The wide bandgap bipolar power switching device is configured to switch between a nonconducting state and a conducting state that allows current flow between the collector terminal of the bipolar transistor and the cathode terminal of the thyristor responsive to application of a first control signal to the base terminal of the bipolar transistor and responsive to application of a second control signal to the gate terminal of the thyristor.

In some embodiments, the electronic device may further include a control circuit configured to generate the first and second control signals, supply the first control signal to the gate terminal of the thyristor, and supply the second control signal to the base terminal of the bipolar transistor to switch the bipolar power switching device to the conducting state such that a load current flows between the collector terminal of the bipolar transistor and the cathode terminal of the thyristor. The control circuit may be further configured to couple the gate terminal of the thyristor to the collector terminal of the bipolar transistor such that the load current is commutated to the gate terminal of the thyristor to switch the bipolar power switching device to the nonconducting state.

In some embodiments, the control circuit may include a first voltage source configured to generate the first control signal configured to switch the bipolar transistor to a conductive state, a second voltage source configured to generate the second control signal configured to switch the thyristor to a conductive state, a first switching element configured to couple the first voltage source to the base terminal of the bipolar transistor to supply the first control signal thereto, a second switching element configured to couple the second voltage source to the gate terminal of the thyristor to supply the second control signal thereto, and a third switching element configured to couple the gate terminal of the thyristor to the collector terminal of the bipolar transistor.

In some embodiments, the control circuit may include a first switching element coupled to the gate terminal of the thyristor, an inverting driver device configured to provide the first control signal to the base terminal of the bipolar transistor and configured to switch the first switching element to provide the second control signal to the gate terminal of the thyristor, a second switching element coupled between the gate terminal of the thyristor and the collector terminal of the bipolar transistor, and a noninverting driver device configured to switch the second switching element to couple the gate terminal of the thyristor to the collector terminal of the bipolar transistor.

In some embodiments, the first switching element may be a wide bandgap metal-oxide-semiconductor (MOS) transistor having a source/drain terminal coupled to the gate terminal of the thyristor and a gate terminal coupled to an output of the inverting driver device. The second switching element may be a wide bandgap commutating bipolar transistor having a collector terminal coupled to the collector terminal of the bipolar transistor, an emitter terminal coupled to the gate terminal of the thyristor, and a base terminal coupled to an output of the noninverting driver device.

In some embodiments, the control circuit may further include an optically triggered driver device configured to provide an output signal responsive to light applied thereto. The inverting driver device and the noninverting driver device may be coupled to an output of the optically triggered driver device. The inverting driver device may be configured to provide the first control signal to the base terminal of the bipolar transistor and may be configured to switch the MOS transistor to a conducting state to provide the second control signal to the gate terminal of the thyristor when light is applied to the optically triggered driver device. The noninverting driver device may be configured to switch the commutating bipolar transistor to a conducting state to couple the collector terminal of the first bipolar transistor to the gate terminal of the thyristor when light is not applied to the optically triggered driver device.

In some embodiments, the control circuit may further include a bypass stage coupled between the gate terminal of the thyristor and the collector terminal of the bipolar transistor. The bypass stage may be configured to conduct current therebetween to switch the bipolar power switching device to the nonconducting state when the current between the collector terminal of the bipolar transistor and the cathode terminal of the thyristor exceeds a predetermined level.

In some embodiments, the bypass stage may include a zener diode that is configured to conduct when the voltage drop between the collector of the bipolar transistor and the gate of the thyristor exceeds a breakdown voltage of the zener diode. In some embodiments, the bypass stage may include a plurality of power diodes connected in series between the gate terminal of the thyristor and the collector terminal of the bipolar transistor.

In some embodiments, the bypass stage may further include a commutating bipolar transistor having a collector terminal coupled to the collector terminal of the bipolar transistor, an emitter terminal coupled to the gate terminal of the thyristor, and a base terminal coupled to the zener diode. The commutating bipolar transistor may be configured to be switched to a conducting state responsive to conduction of the zener diode to provide the load current to the gate terminal of the thyristor and switch the bipolar power switching device to the nonconducting state.

In some embodiments, the bipolar transistor and the thyristor may be included in a common package. An on-resistance between the anode and cathode terminals of the thyristor may decrease as operating temperature of the thyristor increases. An on-resistance between the collector and emitter terminals of the bipolar transistor may increase as operating temperature of the bipolar transistor increases.

In some embodiments, the increase in the on-resistance of the bipolar transistor may be greater than the decrease in the electrical resistance of the thyristor as the respective operating temperatures increase. As such, an electrical resistance of the bipolar power switching device in the conducting state may increase as operating temperature of the bipolar power switching device increases.

In some embodiments, the increase in the on-resistance of the bipolar transistor may be substantially similar to the decrease in the electrical resistance of the thyristor as the respective operating temperatures increase. As such, an electrical resistance of the bipolar power switching device in the conducting state may not substantially change as operating temperature of the bipolar power switching device increases.

In some embodiments, the bipolar power switching device may be configured to provide current saturation capability when the bipolar transistor is operated in the active region.

In some embodiments, the bipolar transistor may be a silicon carbide bipolar junction transistor (BJT), and the thyristor may be a silicon carbide gate turn-off thyristor (GTO).

According to further embodiments of the present invention, a packaged bipolar power switching device includes a wide bandgap bipolar transistor having a base, a collector, and an emitter terminal, and a wide bandgap thyristor having an anode, a cathode, and a gate terminal. The anode terminal of the thyristor is coupled to the emitter terminal of the bipolar transistor. The collector terminal corresponds to a first main terminal of the bipolar power switching device, and the cathode terminal corresponds to a second main terminal of the bipolar power switching device. The bipolar power transistor is configured to switch between a nonconducting state and a conducting state that allows current flow between the first and second main terminals. The bipolar power transistor has a non-negative temperature coefficient, where an electrical resistance between the first and second main terminals does not decrease as operating temperature of the bipolar power switching device increases.

In some embodiments, an on-resistance between the anode and cathode terminals of the thyristor may decrease as an operating temperature of the thyristor increases. An on-resistance between the collector and emitter terminals of the bipolar transistor may increase as an operating temperature of the bipolar transistor increases.

In some embodiments, the increase in the on-resistance of the bipolar transistor may be greater than the decrease in the electrical resistance of the thyristor as the respective operating temperatures increase to provide a positive temperature coefficient where an electrical resistance between the first and second main terminals of the bipolar power switching device in the conducting state increases as operating temperature of the bipolar power switching device increases.

In some embodiments, the increase in the on-resistance of the bipolar transistor is substantially similar to the decrease in the electrical resistance of the thyristor as the respective operating temperatures increase to provide a near-zero temperature coefficient where an electrical resistance between the first and second main terminals of the bipolar power switching device in the conducting state does not substantially change as operating temperature of the bipolar power switching device increases.

According to still further embodiments of the present invention, a packaged bipolar turn-off thyristor device includes a wide bandgap gate turn-off thyristor (GTO) having an anode, a cathode, and a gate terminal, and a wide bandgap bipolar junction transistor (BJT) having a base, a collector, and an emitter terminal. The emitter terminal of the BJT is directly coupled to the anode terminal of the GTO. The bipolar power switching device is configured to switch between a nonconducting state and a conducting state that allows current flow between the collector of the BJT and the cathode of the GTO responsive to application of a first control signal to the base terminal of the BJT and responsive to application of a second control signal to the gate terminal of the GTO.

In some embodiments, an on-resistance between the anode and cathode terminals of the GTO may decrease as operating temperature of the GTO increases, and an on-resistance between the collector and emitter terminals of the BJT may increase as operating temperature of the BJT increases.

In some embodiments, the GTO may include a substrate of a first conductivity type having the cathode terminal thereon, a drift layer of a second conductivity type opposite to the first conductivity type on the substrate opposite the cathode terminal, a base layer of the first conductivity type on the drift layer and having the gate terminal thereon, and a first layer of the second conductivity type on the base layer and having the anode terminal thereon. The BJT may include a layer of the first conductivity type directly on the first layer of the second conductivity type and having the emitter terminal thereon, and a second layer of the second conductivity type on the layer of the first conductivity type. The second layer may include a highly doped first region of the first conductivity type therein having the collector terminal thereon, and a highly doped second region of the second conductivity type therein having the base terminal thereon.

In some embodiments, the first conductivity type may be n-type, and the second conductivity type may be p-type. The substrate and the layers thereon may be silicon carbide.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the scope of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this disclosure and the relevant art and will not be interpreted in an idealized or overly formal sense unless expressly so defined herein.

Referring now to the drawings, FIGS. 1 through 4 are schematic circuit diagrams illustrating various embodiments of the present invention. Transistors and thyristors according to embodiments of the present invention may be formed of silicon carbide having a polytype of 3C, 2H, 4H, 6H, and 15R, or from any of the various Group III-nitride materials useful for fabricating electronic devices. In the illustrated embodiments, the n+ and n− regions, as well as the p+ and p− regions, are designated "+" and "−" to symbolize different doping concentration levels respectively of the same conductivity type material in a manner well understood to those of ordinary skill in this art. As used herein, the "+" and "−" designations do not necessarily imply that a material is degenerate on one hand or semi-insulating on the other. The p-type silicon carbide may be doped, for example, with aluminum or boron and the n-type silicon carbide maybe doped, for example, with nitrogen or phosphorous. P-type nitrides may be doped, for example, with magnesium, while n-type nitrides may be doped, for example, with silicon.

As is known to those skilled in the art, a thyristor is a four-layer latching switching device having an anode and a cathode for current flow and a gate for switching the device from a blocking state to a conducting state, and vice versa. A control signal applied to the gate causes the device to "latch" into an "on" or conductive state, in which current can flow freely between the anode and cathode of the device. The device remains in the conductive state even after the control signal is removed. A second control signal, opposite in polarity to the first control signal, switches the device back into the "off" or blocking state. A specially designed gate turn-off thyristor ("GTO"), however, is typically turned off by a reverse gate pulse. The GTO thyristors generally start conduction by some trigger input and then behave as diodes thereafter. While certain wide bandgap thyristor designs are discussed in more detail below, the design of wide bandgap thyristors is generally known in the art. For example, U.S. Pat. No. 5,539,217 describes the design and manufacture of silicon carbide (SiC) thyristors. Such silicon carbide thyristors may exhibit improved power handling capabilities over similar silicon thyristors.

Some embodiments of the present invention may arise from realization that conventional thyristors may be difficult to implement in parallel due to differences in inherent on-resistances, especially as operating temperatures increase. In particular, some conventional SiC thyristors may have a negative temperature coefficient (NTC), where the on-resistance (and thus, the forward voltage drop $V_F$) across the device may decrease as operating temperature increases. Such a negative temperature coefficient for the forward voltage drop may increase the conducting current, due to the increase in the junction temperature. This may lead to current concentration on one or more thyristors connected in parallel, which may result in terminal run-away.

Embodiments of present invention provide a bipolar power switching device including a wide bandgap thyristor and a wide bandgap bipolar transistor connected in series. Such wide bandgap devices include an active semiconductor layer of a wide bandgap material, such as silicon carbide (SiC), gallium nitride (GaN), and/or other Group-III nitride material. In particular, embodiments of the present invention provide a SiC thyristor having at least a SiC bipolar junction transistor (BJT) connected in series with the thyristor anode terminal. Such configuration, also referred to herein as a Bipolar Turn-Off thyristor ("BTO"), may provide enhanced operating characteristics as compared to conventional SiC thyristors.

In particular, bipolar power switching devices according to embodiments of the present invention can provide a near-zero temperature coefficient (e.g., such that the on-resistance across the device does not substantially change as operating temperature increases) or even a positive temperature coefficient (PTC) (e.g., such that the on-resistance across the device increases as operating temperature increases) for the forward voltage drop $V_F$ by connecting a wide bandgap BJT in series with a wide bandgap thyristor. For example, a SiC BJT, which has a positive temperature coefficient for the forward voltage drop, can be specifically chosen to reduce the negative temperature coefficient of an SiC thyristor, and may provide a near-zero or even slightly positive temperature coefficient across the main terminals of the BTO. More particularly, the SiC BJT may act like a resistor when it is operated in saturation region, and may provide a positive temperature coefficient for the forward voltage drop. Accordingly, bipolar power switching devices according to embodiments of the present invention can be more easily paralleled, as the forward voltage drop may increase with increasing temperature to promote more even current distribution in parallel connected devices.

In addition, bipolar power switching devices according to some embodiments of the present invention may provide current saturation capability when the SiC BJT operates in the active region. The current saturation capability can protect such devices from inrush current during turning-on, and/or current over shooting in the case of short-circuit failure. Bipolar power switching devices according to some embodiments of the present invention may also provide a negative temperature coefficient for the saturation current.

Bipolar power switching devices according to some embodiments of the present invention can also switch at relatively high speed. For example, a BTO according to some embodiments of the present invention can be turned off faster than conventional SiC thyristors, as the SiC BJT may be used to turn off the anode current of the SiC thyristor at a relatively high rate. Also, a bypass stage including a zener diode and/or several power diodes connected in series may be used to divert anode current to the thyristor gate terminal to turn off the thyristor. Bipolar power switching devices according to some embodiments of the present invention can also operate at relatively high temperatures, due to the absence of a gate dielectric film.

Figure 1:
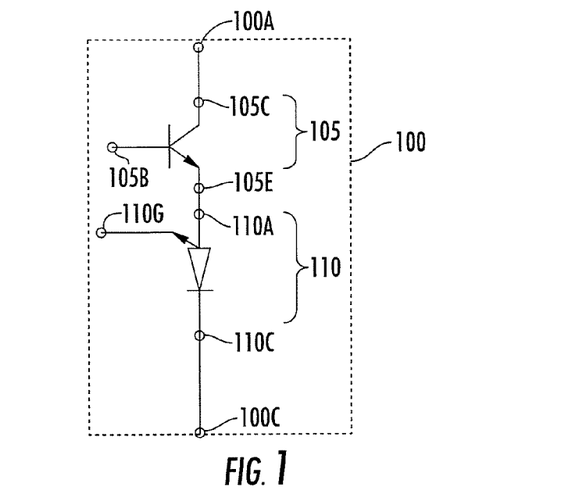
FIGS. 1-4 are schematic circuit diagrams illustrating devices and/or circuits according to some embodiments of the invention.

FIG. 1 is a schematic diagram illustrating a bipolar power switching device or "BTO" 100 according to some embodiments of the present invention. Referring now to FIG. 1, the BTO 100 includes a wide bandgap bipolar transistor (illustrated in FIG. 1 as a SiC BJT emitter follower 105) connected in series with a wide bandgap thyristor (illustrated in FIG. 1 as a SiC GTO 110) to provide a pseudo cascode pair. In particular, the SiC GTO 110 includes a gate terminal 110g, a cathode terminal 110c, and an anode terminal 110a. The SiC BJT 105 includes a base terminal 105b, a collector terminal 105c, and an emitter terminal 105e. The emitter terminal 105e of the SiC BJT 105 is directly coupled to the anode terminal 110a of the SiC GTO 110. The collector 105c of the SiC BJT 105 is coupled to and/or provides the anode terminal (also referred to herein as a first main terminal) 100a for the BTO, and the cathode 110c of the SiC GTO 110 is coupled to and/or provides the cathode terminal (also referred to herein as a second main terminal) 100c for the BTO 100. The base terminal 105b and the gate terminal 110g provide control terminals for the BTO 100. The BJT 105 and the GTO 110 may be provided in a common package, and may be selected based on their particular temperature coefficients and/or other characteristics to provide a packaged BTO 100 having a non-negative temperature coefficient and/or other desired characteristics. Although described herein with reference to silicon carbide devices, it will be understood that the BJT 105 and/or the GTO 110 may be fabricated from other wide bandgap semiconductor materials, for example, as described in any of the patents described herein. Also, while FIG. 1 illustrates an npn-type BJT 105 and a p-type thyristor 110, it will be understood that a pnp-type BJT and an n-type thyristor may also be used in some embodiments.

Application of respective control signals to the base 105b and the gate 110g terminals switches the BTO 100 from a nonconducting state (where current does not flow between the anode 100a and cathode 100b) to a conducting state (which allows current flow between the anode 100a and cathode 100c). More particularly, application of a control signal to the gate 110g causes the SiC GTO 110 to "latch" into a conductive or "on" state, which allows current flow between the anode 110a and cathode 110c. Likewise, application of a control signal to the base 105b causes the SiC BJT 105 to turn on, conducting current between the collector 105c and emitter 105e terminals. In particular, the control signal applied to the base 105b is sufficient to operate the BJT 105 in the saturation region, e.g., where changes in the base current $I_B$ have little effect on the collector current $I_C$. As similar current levels may be provided to the base 105b and the gate 110g to activate the BJT 105 and the GTO 110 to a conducting state, respectively, a control circuit may be used to generate and supply the control signals to both the base 105b of the BJT 105 and the gate 110g of the GTO 110.

Figure 2:
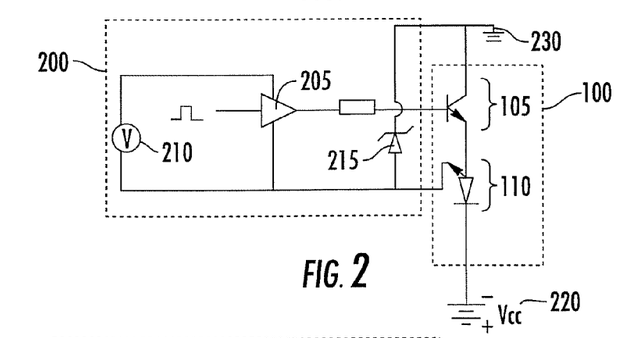

FIG. 2 is a schematic diagram illustrating an example circuit for driving the BTO 100 of FIG. 1 in accordance with some embodiments. Referring now to FIG. 2, the control circuit 200 includes a voltage source 210, a buffer amplifier or driver 205 coupled to the base 105b of the BJT 105, and a bypass stage (illustrated in FIG. 2 as a zener diode 215) coupled between the collector 105c of the BJT 105 and the gate 110g of the GTO 110. The collector 105c of the BJT 105 (e.g., the anode terminal 100a of the BTO 100) is coupled to ground 230, while the cathode 110c of the GTO (e.g., the cathode terminal 100c of the BTO 100) is coupled to the negative connection of supply voltage Vcc 220. The bypass stage is configured to conduct when the voltage drop between the gate 110g of the GTO 110 and the collector 105c of the BJT 105 exceeds the breakdown voltage of the zener diode 215 to provide a fault current limiting feature. Although illustrated with reference to zener diode 215 in FIG. 2, other elements (for example, one or more power diodes connected in series) may be used to implement the bypass stage in some embodiments.

Figure 3:
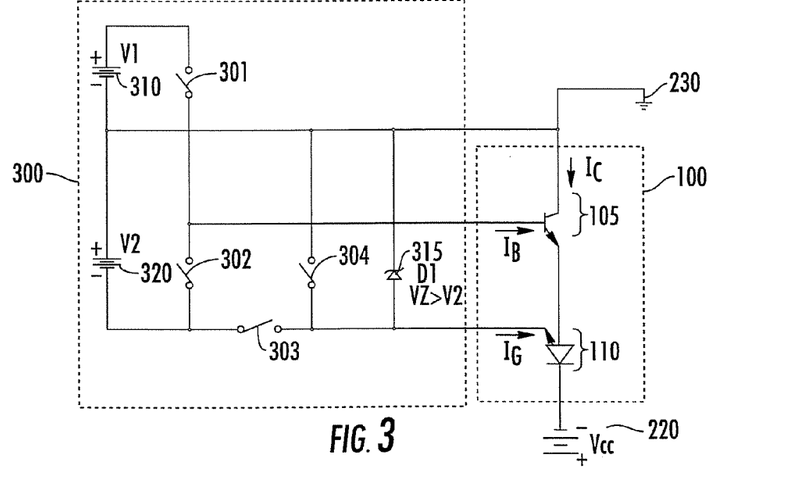

FIG. 3 illustrates an example circuit 300 for driving the BTO 100 in greater detail in accordance with some embodiments. The control circuit 300 for controlling the BTO 100 includes two anode-referenced voltage sources V1 310 and V2 320, four switches 301-304, and a bypass stage, implemented in FIG. 3 by a voltage clamp diode (or zener diode) D1 315. V1 310 provides the control signal to the base 105c to drive the SiC BJT 105. V2 320 provides the control signal to the gate 110g to drive the SiC GTO 110. The clamp diode D1 315 has a breakdown voltage Vz that is greater than the voltage provided by V2 320.

To turn on the BTO 100 to a conducting state, switches 301 and 303 are closed and switches 302 and 304 are open. Closing switch 301 connects the base 105b to the positive connection of V1 310. Being an emitter follower (also referred to as a "common collector"), the base 105b of the SiC BJT 105 should be pulled above the collector potential to place the SiC BJT 105 in saturation. V1 310 is used to provide this voltage, and has a voltage rating that is greater than the base-to-emitter voltage drop $V_{BE}$ of the SiC BJT 105. For example, in some embodiments, V1 310 may be configured to provide a voltage of about 3V to about 3.5 V. V1 310 is also configured to regulate the base current $I_B$ that is applied to the SiC BJT 105. Closing switch 303 connects the gate 110g of the SiC GTO 110 to the negative connection of V2 320, which causes the SiC GTO 110 to transition from a blocking or nonconducting state to a conducting state. The voltage rating of V2 320 is also set to a value somewhat higher than the forward voltage of the anode-to-gate junction of the SiC GTO 110. For example, in some embodiments, V2 330 may be configured to provide a voltage of about 3V to about 3.5 V. V2 320 is also configured to regulate the gate current $I_G$ that is applied to the SiC GTO 110. As such, when the BJT 105 and the GTO 110 are both switched to a conducting state, a load current may flow between the anode 100a and cathode 100c terminals of the BTO 100.

To turn off the BTO 100 to a blocking or nonconducting state, switches 301 and 303 are opened and switches 302 and 304 are closed. The opening of switch 301 and the closing of switch 302 tie the base 105b of the SiC BJT 105 to the negative terminal of V2 320, thereby turning off the SiC BJT 105. The opening of switch 303 and the closing of switch 304 tie the gate 110g of the SiC GTO 110 to the anode 100a of the BTO 100. As a result, the load current is commutated from the BTO anode 100a to the GTO gate 110g. This causes the anode-to-gate junction of the SiC GTO 110 to be reverse biased, resulting in rapid turn-off of the SiC GTO 110.

Still referring to FIG. 3, the control circuit 300 including the BTO 100 according to some embodiments of the present invention provides a fault current limiting feature. In particular, the SiC BJT 105 remains in hard saturation so long as its collector current $I_C$ is below the product of the base current $I_B$ and the current gain β of the SiC BJT 105. Once this criterion is no longer met, the SiC BJT 105 enters its active region and limits the current to the product of the base current $I_B$ and current gain β. This causes the collector-to-emitter voltage $V_{CE}$ of the SiC BJT 105 to rapidly increase, and as a result, the SiC GTO gate-to-SiC BJT collector voltage also increases at a corresponding rate. The voltage drop between the gate 110g and the collector 105e rises until it exceeds the breakdown voltage $V_Z$ of the clamp diode D1 315, at which point the clamp diode D1 315 begins to conduct. The clamp or breakdown voltage Vz is greater than the voltage provided by V2 320, which prevents clamp diode D1 315 from conducting in normal operation. The combination of the increase in the collector-to-emitter voltage $V_{CE}$ of the SiC BJT 105 and the clamping of the SiC BJT collector 105c to the SiC GTO gate 110g by clamp diode D1 315 causes the anode-to-gate junction of the SiC GTO 110 to be reverse biased. This forces the load current to commutate from the BTO anode 100a to the GTO gate 110g, which rapidly turns off the SiC GTO 110, thereby interrupting the fault current.

Figure 4:
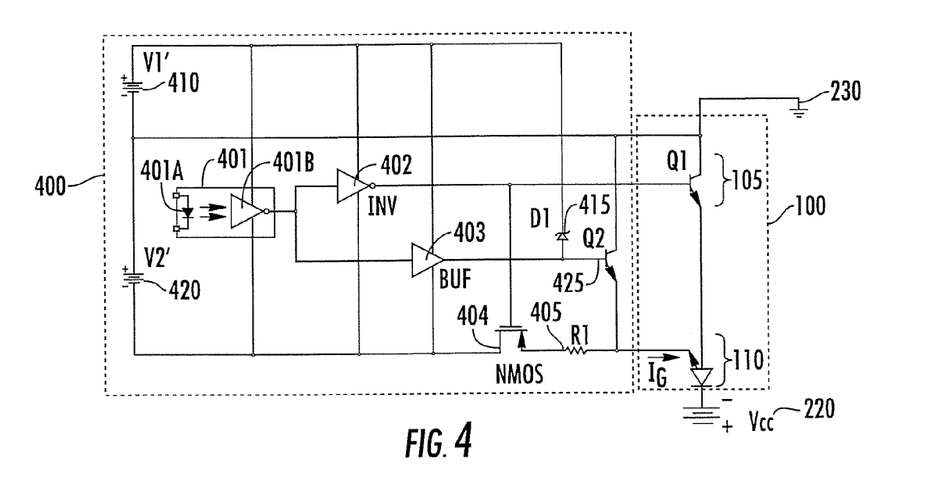

Another example control circuit 400 according to some embodiments of the present invention is illustrated in FIG. 4. As shown in FIG. 4, the control circuit 400 uses a BJT Q2 425 as the commutation element for the SiC GTO 110. Referring now to FIG. 4, when the BTO 100 is in the conducting state, a load current flows from the anode terminal 100a of the BTO 100, through SiC BJT Q1 105 and the SiC GTO 110, and to the cathode terminal 100c of the BTO 100. The remainder of the circuit 400 is used to control the SiC GTO 110 and the SiC BJT Q1 105. In particular, the control circuit 400 includes an optically triggered driver 401 (including a light emitting diode or other light source 401a and an inverting driver 401b) to provide an isolated turn on/turn off signal, an inverting driver INV 402 and a non-inverting driver BUF 403, a low-voltage n-type metal-oxide semiconductor (NMOS) transistor 404 and a resistor R1 405 to provide turn-on gate current for the SiC GTO 110, and a bypass stage (including BJT Q2 425 and zener diode D1 415), which is used to clamp the SiC GTO gate 110g during commutation and fault conditions. The BTO 100 includes the cascode SiC BJT Q1 105 and the SiC GTO 110. The cathode terminal 100c of the BTO 100 is coupled to the negative terminal of supply voltage Vcc 220. Two floating DC voltage sources, V1' 410 and V2' 420, which are referenced to the grounded anode terminal 100a of the BTO 100, are used to supply power.

Operation of the example control circuit 400 of FIG. 4, as described in detail below, is based on the following implementation. In particular, the reference point or ground 230 for the drive voltages is the anode terminal 100a of the BTO 100. The outputs of the inverting driver INV 402 and the non-inverting driver BUF 403 provide both positive and negative potentials referenced to the anode terminal 100a of the BTO 100. The voltage swing is from +V1' (high) and −V2' (low), where the voltages provided by V1' 410 and V2' 420 may be similar to those provided by the voltage sources V1 310 and V2 320, respectively, of FIG. 3. The magnitude of the voltage provided by voltage source V1' 410 and the current sourcing capability of the inverting driver INV 402 and non-inverting driver BUF 403 are sufficient to pull the emitters of SiC BJT Q1 105 and BJT Q2 425 to anode potential under many (if not all) collector current conditions. The magnitude of the voltage provided by voltage source V2' 420 and the current capability of the NMOS transistor 404 are sufficient to turn on the SiC GTO 110 (when SiC BJT Q1 105 is conducting) under many (if not all) load current conditions. Adequate current limiting is provided on the outputs of the inverting driver INV 402, the non-inverting driver BUF 403, and the NMOS transistor 404 to allow safe operation under many (if not all) operating conditions.

Still referring to FIG. 4, the blocking or nonconducting state of the BTO 100 is described as follows. When the SiC GTO 110 is in the blocking or nonconducting state and light is not provided by the light source 401a to trigger the optically triggered driver 401, the output of inverting driver INV 402 is at a voltage −V2', and the output of non-inverting driver BUF 403 is at a voltage +V1'. As a result, SiC BJT Q1 105 and NMOS transistor 404 are in the "off" or blocking state, and BJT Q2 425 is in "on" or conducting state. This effectively ties the SiC GTO gate 110g to the BTO anode 100a, providing a robust blocking state with relatively high immunity to changes in voltage over time (dV/dt).

The transition from the blocking state to the conducting state of the BTO 100 is as follows. When light is provided by the light source 401a to trigger the optically triggered driver 401 to provide the turn on signal, the output of inverting driver INV 402 swings to +V1', and the output of non-inverting driver BUF 403 swings to −V2'. As a result, BJT Q2 425 is turned off, and SiC BJT Q1 105 and NMOS transistor 404 are turned on. With SiC BJT Q1 105 in the conducting state, the anode 110a of SiC GTO 110 is strongly connected to the anode terminal 100a of the BTO 100. This causes current to flow from DC voltage source V2' 420 through NMOS transistor 404, to resistor R1 405, into the gate 110g of the SiC GTO 110, through the anode 110a of the SiC GTO 110, and back to DC voltage source V2' 420. This action forward biases the gate 110g of the SiC GTO 110, with the gate current $I_G$ limited by the resistance of resistor R1 405. This puts the BTO 100 in the conducting state, and a load current flows between the anode terminal 100a and the cathode terminal 100c. During this time, NMOS transistor 404 may be biased in such a way to limit its drain current to a level appropriate to drive the SiC GTO gate 110g.

Operation of the BTO 100 in the conducting state is as follows. The load current flows into the anode terminal 100a of the BTO 100, into the collector 105c and out of the emitter 105e of SiC BJT Q1 105, into the anode 110a and out of the cathode 110c of the SiC GTO 110, and out of the cathode terminal 100c of the BTO 100. The SiC BJT Q1 105 and the SiC GTO 110 are connected in series to decrease the anode-to-cathode voltage drop of the SiC GTO 110. In particular, the SiC BJT 105 has a positive temperature coefficient, where the collector-to-emitter voltage drop $V_{CE}$ increases with increases in operating temperature. As such, SiC BJT Q1 105 in each packaged BTO 100 according to some embodiments of the present invention may be specifically selected based on its positive temperature coefficient for the forward voltage drop and based on the negative temperature coefficient of the SiC GTO 110 to reduce and/or effectively negate the negative temperature coefficient of the SiC GTO 110, and may even provide a positive temperature coefficient for the BTO 100 in some embodiments. The negative temperature coefficient of the SiC GTO 110 may make static current sharing difficult in parallel arrays of conventional SiC GTOs. Accordingly, by employing the SiC BJT Q1 105 in series with the SiC GTO 110, the BTO 100 may have a non-negative (e.g., near-zero or even positive) temperature coefficient, which may promote more even current distribution and ease in paralleling BTOs according to some embodiments of the present invention.

The transition from the conducting state to the blocking state of the BTO 100 is as follows. When the light is not provided by the light source 401a to trigger the optically triggered driver 401, the output of inverting driver INV 402 driver swings to −V2', and the output of non-inverting driver BUF 403 swings to +V1'. As a result, SiC BJT Q1 105 and NMOS transistor 404 are turned off, and BJT Q2 425 is turned on. With the SiC BJT Q1 105 in a nonconducting state, the anode 110a of the SiC GTO 110 is disconnected from the anode terminal 100a of the BTO 100. With BJT Q2 425 in a conducting state and NMOS transistor 404 in a nonconducting state, the gate 110g of the SiC GTO 110 is disconnected from the voltage source V2' 420 and is connected to the anode terminal 100a of the BTO 100. Accordingly, the load current is commutated from the anode terminal 100a into the gate 110g of the SiC GTO 110, causing the SiC GTO 110 to be rapidly turned off.

Embodiments of the present invention as illustrated in FIG. 4 may also provide an over current feature that turns off the SiC GTO 110 in the event that the load current exceeds a predetermined value. More particularly, the collector current k provided by SiC BJT Q1 105 may be determined by the product of its base current $I_B$ and its current gain $\beta$. When this value is exceeded, SiC BJT Q1 105 enters its linear region and begins to behave as a constant current source. As a result, the collector-to-emitter voltage $V_{CE}$ of SiC BJT Q1 105 may rapidly increase, which results in an increase in the voltage between the BTO anode terminal 100a and the SiC GTO gate 110g. When the anode-to-gate voltage drop exceeds the breakdown voltage of zener diode D1 415, the diode D1 415 will conduct, causing BJT Q2 425 to clamp the gate voltage to a predetermined level. As the fault current increases, the collector-to-emitter voltage $V_{CE}$ across SiC BJT Q1 105 will further increase, thereby reverse biasing the anode-to-gate junction of the SiC GTO 110 and causing the SiC GTO 110 to turn off, interrupting the load current. The voltage at which BJT Q2 425 clamps the gate 110g of the SiC GTO 110 may be selected to prevent damage to the control circuit 400.

As discussed above with reference to FIG. 4, SiC BJT Q1 105 may be selected to support continuous full load current in the conducting state, and to support voltage V2' when in the blocking state. During conduction, the collector-to-emitter voltage drop $V_{CE}$ across SiC BJT Q1 105 should remain low enough to forward bias the anode-to-gate junction of the SiC GTO 110. BJT Q2 425 may also be selected to support full load current in the conducting state (e.g., during the commutation of the SiC GTO 110), and to support voltage V2' when in the blocking state. During conduction, the collector-to-emitter voltage drop $V_{CE}$ across BJT Q2 425 should be less than V2', to reduce and/or prevent possible damage to NMOS transistor 404.

Figure 5:
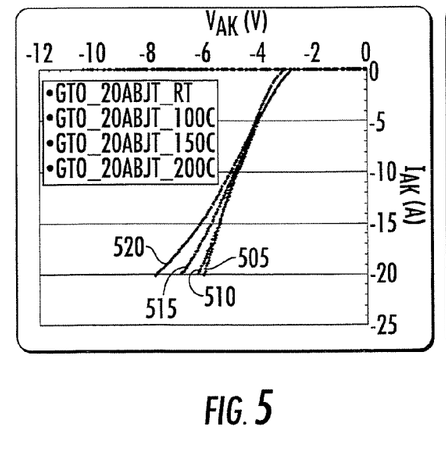
FIGS. 5 and 6 are graphs illustrating current-voltage (I-V) characteristics of devices according to some embodiments of the invention.
Figure 6:
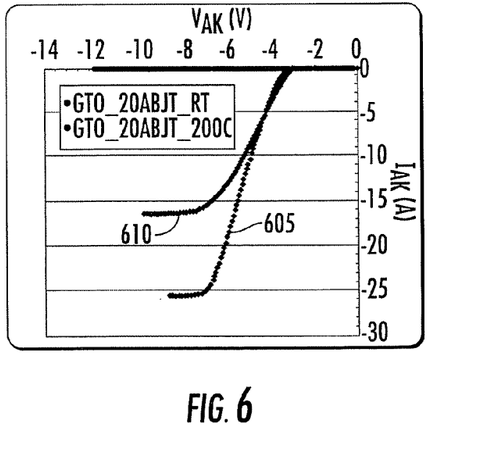

FIGS. 5 and 6 are graphs illustrating current-voltage (I-V) characteristics of a BTO according to some embodiments of the present invention. In particular, FIGS. 5 and 6 illustrate forward I-V characteristics of an SiC BTO according to some embodiments of the present invention that includes a 10 kV SiC GTO and a 1600 V SiC BJT. As shown in FIG. 5, such a configuration provides a positive temperature coefficient, as the on-resistance of the BTO increases with temperature. In particular, the on-resistance of the BTO increases (illustrated by the increased voltage drop across the BTO) as the operating temperature increases, as shown by lines 505 (room temperature), 510 (about 100° C.), 515 (about 150° C.), and 520 (about 200° C.). FIG. 6 illustrates that a SiC BTO according to some embodiments of the present invention provides current saturation capability as operating temperature increases, as shown by line 605 (room temperature) and line 610 (about 200° C.).

Figure 7:
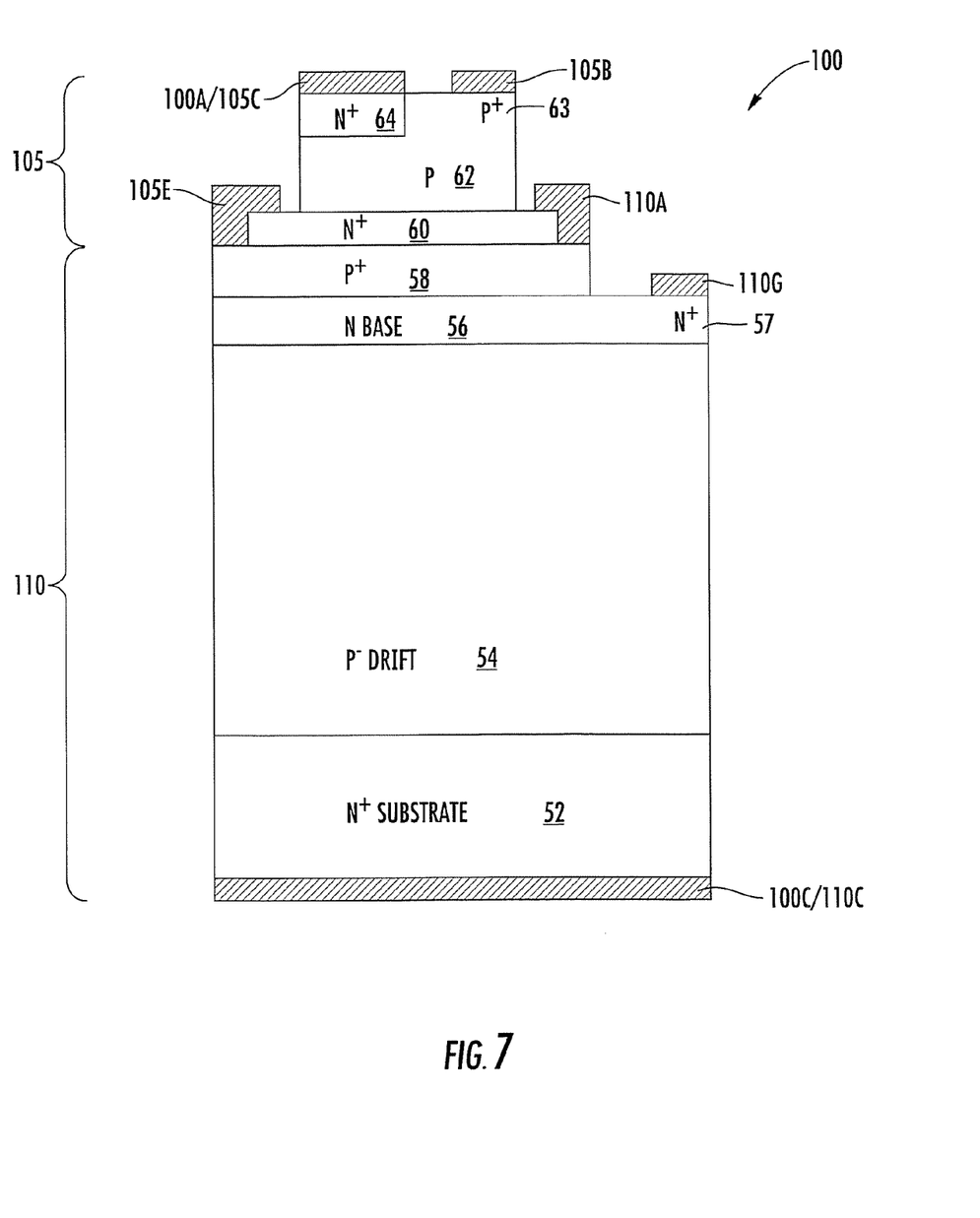
FIG. 7 is a cross sectional illustration of the device of FIG. 1.

FIG. 7 is a cross-sectional view illustrating a SiC BTO 100 according to some embodiments of the present invention that includes a bipolar transistor 105 and a thyristor 110 on a common substrate. In some embodiments, the bipolar transistor 105 and the thyristor 110 described in detail above may be fabricated and/or subsequently provided on an n-type 4H silicon carbide layer 52. SiC bipolar transistors are described, for example, in U.S. Pat. No. 4,945,394, while SiC thyristors are described, for example, in U.S. Pat. No. 5,539,217, the disclosures of which are incorporated by reference herein in their entireties.

As shown in FIG. 7, a BTO 100 according to some embodiments includes an n-type layer 52. A contact 100c/110c is provided on the n-type layer 52, and provides the cathode terminal for both the BTO 100 and the GTO 110. A p-type drift layer 54 is provided on the n-type layer 52, an n-type base layer 56 is provided on the p-type drift layer 54. A gate contact 110g for the GTO 110 is provided on a highly doped n+ region 57 of the n-type base layer 56. A p-type layer 58 is provided on the n-type base layer 56, and an n-type layer 60 is provided on the p-type layer 58. Contacts 105e and 110a are provided on the n-type layer 60 and the p-type layer 58 as an emitter terminal for the BJT 105 and an anode terminal for the GTO 110, respectively. A p-type layer 62 is provided on the n-type layer 60. The p-type layer 62 includes a highly doped p+ region 63, and a highly-doped n+ region 64. A base contact 105b for the BJT 105 is provided on the highly-doped p+ region 63, and a contact 100a/105c is provided on the highly-doped n+ region 64 as an anode terminal for the BTO 100 and a collector terminal for the BJT 105.

Accordingly, the n-type region 64, the p-type layer 62, and the n-type layer 60 define the SiC BJT 105. The contact 105b on the p+ region 63 provides the base terminal of the BJT 105, the contact 100a/105c on the n+ region 64 provides the collector terminal of the BJT 105 (and the anode terminal of the BTO 100), and the contact 105e on the n-type layer 60 provides the emitter terminal of the BJT. Also, the p-type layer 58, the n-type base layer 56, the p-type drift layer 54, and the n-type layer 52 define the SiC GTO 110. The contact 110g on the n-type base layer 56 provides the gate terminal of the GTO 110, the contact 110a on the p-type layer 58 provides the anode terminal of the GTO 110, and the contact 100c/110c on the n-type layer 52 provides the cathode terminal of the GTO 110 (and the cathode terminal of the BTO 100). The n-type layer 60, which provides the BJT emitter, is directly on the p-type layer 58, which provides the GTO anode, such that the BJT 105 and the GTO 110 are connected in series.

Embodiments of the present invention as described above with reference to FIGS. 1-7 can be achieved by monolithic integration or a hybrid combination of the bipolar transistor 105 and the thyristor 110. As used herein, a "hybrid" bipolar power switching device may refer to a cascode configuration and/or other combination of a discrete bipolar transistor 105 and a discrete thyristor 110. A "monolithic" bipolar power switching device may refer to a device where both the bipolar transistor 105 and the thyristor 110 are fabricated in the same semiconductor chip and/or substrate. A packaged bipolar power switching device according to some embodiments of the present invention may include both monolithic and hybrid combinations of the bipolar transistor 105 and the thyristor 110.

While the above embodiments are described with reference to particular figures, it is to be understood that some embodiments of the present invention may include additional and/or intervening layers, structures, or elements, and/or particular layers, structures, or elements may be deleted. More generally, the foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed:

1. An electronic device, comprising:
 a wide bandgap thyristor having an anode terminal, a cathode terminal, and a gate terminal; and
 a wide bandgap bipolar transistor having a base terminal, a collector terminal, and an emitter terminal, the emitter terminal of the bipolar transistor being coupled to the anode terminal of the thyristor,
 wherein at least one of the bipolar transistor and the thyristor is selected such that, as an operating temperature increases, an increase in an on-resistance between the collector and emitter terminals of the bipolar transistor is greater than or substantially equal to a decrease in an on-resistance between the anode and cathode terminals of the thyristor.

2. An electronic device, comprising:
 a wide bandgap thyristor having an anode terminal, a cathode terminal, and a gate terminal;
 a wide bandgap bipolar transistor having a base terminal, a collector terminal, and an emitter terminal, the emitter terminal of the bipolar transistor being coupled to the anode terminal of the thyristor, wherein the bipolar transistor and the thyristor define a wide bandgap bipolar power switching device; and a control circuit configured to generate first and second control signals, supply the second control signal to the gate terminal of the thyristor and supply the first control signal to the base terminal of the bipolar transistor to switch the bipolar power switching device to a conducting state such that a load current flows between the collector terminal of the bipolar transistor and the cathode terminal of the thyristor, wherein the control circuit is further configured to couple the gate terminal of the thyristor to the collector terminal of the bipolar transistor such that the load current is commutated to the gate terminal of the thyristor to switch the bipolar power switching device to a nonconducting state.

3. The electronic device of claim 2, wherein the control circuit comprises:

a first voltage source configured to generate the first control signal configured to switch the bipolar transistor to a conductive state;

a second voltage source configured to generate the second control signal configured to switch the thyristor to a conductive state;

a first switching element configured to couple the first voltage source to the base terminal of the bipolar transistor to supply the first control signal thereto;

a second switching element configured to couple the second voltage source to the gate terminal of the thyristor to supply the second control signal thereto; and a third switching element configured to couple the gate terminal of the thyristor to the collector terminal of the bipolar transistor.

4. The electronic device of claim 2, wherein the control circuit comprises:

a first switching element coupled to the gate terminal of the thyristor;

an inverting driver device configured to provide the first control signal to the base terminal of the bipolar transistor and configured to switch the first switching element to provide the second control signal to the gate terminal of the thyristor;

a second switching element coupled between the gate terminal of the thyristor and the collector terminal of the bipolar transistor; and a noninverting driver device configured to switch the second switching element to couple the gate terminal of the thyristor to the collector terminal of the bipolar transistor.

5. The electronic device of claim 4, wherein:

the first switching element comprises a wide bandgap metal-oxide-semiconductor (MOS) transistor having a source/drain terminal coupled to the gate terminal of the thyristor and a gate terminal coupled to an output of the inverting driver device; and the second switching element comprises a wide bandgap commutating bipolar transistor having a collector terminal coupled to the collector terminal of the bipolar transistor, an emitter terminal coupled to the gate terminal of the thyristor, and a base terminal coupled to an output of the noninverting driver device.

6. The electronic device of claim 5, wherein the control circuit further comprises:

an optically triggered driver device configured to provide an output signal responsive to light applied thereto, wherein the inverting driver device and the noninverting driver device are coupled to an output of the optically triggered driver device, wherein the inverting driver device is configured to provide the first control signal to the base terminal of the bipolar transistor and configured to switch the MOS transistor to a conducting state to provide the second control signal to the gate terminal of the thyristor when light is applied to the optically triggered driver device, and wherein the noninverting driver device is configured to switch the commutating bipolar transistor to a conducting state to couple the collector terminal of the first bipolar transistor to the gate terminal of the thyristor when light is not applied to the optically triggered driver device.

7. The electronic device of claim 2, wherein the control circuit further comprises:

a bypass stage coupled between the gate terminal of the thyristor and the collector terminal of the bipolar transistor and configured to conduct current therebetween to switch the bipolar power switching device to the nonconducting state when the current between the collector terminal of the bipolar transistor and the cathode terminal of the thyristor exceeds a predetermined level.

8. The electronic device of claim 7, wherein the bypass stage comprises a zener diode that is configured to conduct when the voltage drop between the collector of the bipolar transistor and the gate of the thyristor exceeds a breakdown voltage of the zener diode.

9. The electronic device of claim 8, wherein the bypass stage further comprises a commutating bipolar transistor having a collector terminal coupled to the collector terminal of the bipolar transistor, an emitter terminal coupled to the gate terminal of the thyristor, and a base terminal coupled to the zener diode, wherein the commutating bipolar transistor is configured to be switched to a conducting state responsive to conduction of the zener diode to provide the load current to the gate terminal of the thyristor and switch the bipolar power switching device to the nonconducting state.

10. The electronic device of claim 7, wherein the bypass stage comprises a plurality of power diodes connected in series between the gate terminal of the thyristor and the collector terminal of the bipolar transistor.

11. The electronic device of claim 2, wherein the bipolar transistor and the thyristor are included in a common package, wherein an on-resistance between the anode and cathode terminals of the thyristor decreases as operating temperature of the thyristor increases, and wherein an on-resistance between the collector and emitter terminals of the bipolar transistor increases as operating temperature of the bipolar transistor increases.

12. The electronic device of claim 11, wherein the increase in the on-resistance of the bipolar transistor is greater than the decrease in the on-resistance of the thyristor as the respective operating temperatures increase such that an electrical resistance of the bipolar power switching device in the conducting state increases as operating temperature of the bipolar power switching device increases.

13. The electronic device of claim 11, wherein the increase in the on-resistance of the bipolar transistor is substantially similar to the decrease in the on-resistance of the thyristor as the respective operating temperatures increase such that an electrical resistance of the bipolar power switching device in the conducting state does not substantially change as operating temperature of the bipolar power switching device increases.

14. The electronic device of claim 2, wherein the bipolar power switching device is configured to provide current saturation capability when the bipolar transistor is operated in the active region.

15. The electronic device of claim 2, wherein the bipolar transistor comprises a silicon carbide bipolar junction transistor (BJT), and wherein the thyristor comprises a silicon carbide gate turn-off thyristor (GTO).

16. A packaged bipolar turn-off thyristor device, comprising:
a wide bandgap gate turn-off thyristor (GTO) having an anode terminal, a cathode terminal, and a gate terminal; and
a wide bandgap bipolar junction transistor (BJT) having a base terminal, a collector terminal, and an emitter terminal, the emitter terminal of the BJT being directly coupled to the anode terminal of the GTO,
wherein an on-resistance between the anode and cathode terminals of the GTO decreases as an operating temperature of the GTO increases, wherein an on-resistance between the collector and emitter terminals of the BJT increases as an operating temperature of the BJT increases, and wherein at least one of the BJT and the GTO is selected such that the increase in the on-resistance of the BJT is greater than or substantially equal to the decrease in the on-resistance of the GTO.

17. The device of claim 16, wherein the GTO comprises:
a substrate of a first conductivity type having the cathode terminal thereon;
a drift layer of a second conductivity type opposite to the first conductivity type on the substrate opposite the cathode terminal;
a base layer of the first conductivity type on the drift layer and having the gate terminal thereon; and
a first layer of the second conductivity type on the base layer and having the anode terminal thereon,
and wherein the BJT comprises:
a layer of the first conductivity type directly on the first layer of the second conductivity type and having the emitter terminal thereon; and
a second layer of the second conductivity type on the layer of the first conductivity type, the second layer including a highly doped first region of the first conductivity type therein having the collector terminal thereon, and a highly doped second region of the second conductivity type therein having the base terminal thereon.

18. The device of claim 17, wherein the first conductivity type comprises n-type, and wherein the second conductivity type comprises p-type.

19. The device of claim 17, wherein the substrate and the layers thereon comprise silicon carbide.

* * * * *

UNITED STATES PATENT AND TRADEMARK OFFICE
CERTIFICATE OF CORRECTION

PATENT NO.         : 8,294,507 B2
APPLICATION NO.    : 12/437929
DATED              : October 23, 2012
INVENTOR(S)        : Zhang et al.

Page 1 of 1

It is certified that error appears in the above-identified patent and that said Letters Patent is hereby corrected as shown below:

On Title Page:
Item (56), References Cited:

Page 3, Foreign Patent Documents, right column, Line 2:
"WO 2004/020706 A1 3/2001"
Please correct "3/2001" to read -- 03/2004 --

Page 3, Other Publications, right column, Line 26: Please correct "UNMOSFET"
to read -- UMOSFET --
Line 29, Please correct "Transactioins" to read -- Transactions --
Line 44, Please correct "Capano, M.S., et al.," to read -- Capano, M.A., et al., --
Line 63, Please correct "1215-1257" to read -- 1215-1217 --

Page 4, Other Publications, left column, Line 26:
Please replace "vol. 441," to read -- vol. 141, --
Page 4, right column, Line 25: Please replace "Jun. 23-24," to read -- June 23-25, --
Line 39, Please correct "No. 17," to read -- No. 7, --
Line 61, Please correct "carbide studies" to read -- carbide studied --

Page 5, Other Publications, left column, Line 7:
Please correct "Devices on ICs," to read -- Devices and ICs, --
Page 5, right column, Line 14: Please replace "16750?mtpl="
to read -- 16750?tmpl= --

Signed and Sealed this
Twenty-fourth Day of September, 2013

Teresa Stanek Rea
*Deputy Director of the United States Patent and Trademark Office*